(12) United States Patent
Nayar et al.

(10) Patent No.: US 8,934,034 B2
(45) Date of Patent: Jan. 13, 2015

(54) GENERALIZED ASSORTED PIXEL CAMERA SYSTEMS AND METHODS

(75) Inventors: Shree K Nayar, New York, NY (US); Fumihito Yasuma, New York, NY (US); Tomoo Mitsunaga, Kawasaki (JP)

(73) Assignees: The Trustees of Columbia University in the City of New York, New York, NY (US); Sony Corporation, Tokyo (JP)

(*) Notice: Subject to any disclaimer, the term of this patent is extended or adjusted under 35 U.S.C. 154(b) by 703 days.

(21) Appl. No.: 12/736,333

(22) PCT Filed: Mar. 27, 2009

(86) PCT No.: PCT/US2009/038510
§ 371 (c)(1),
(2), (4) Date: May 11, 2011

(87) PCT Pub. No.: WO2009/120928
PCT Pub. Date: Oct. 1, 2009

(65) Prior Publication Data
US 2011/0211099 A1 Sep. 1, 2011

Related U.S. Application Data

(60) Provisional application No. 61/194,725, filed on Sep. 30, 2008, provisional application No. 61/072,301, filed on Mar. 28, 2008.

(51) Int. Cl.
*H04N 3/14* (2006.01)
*H04N 5/335* (2011.01)
(Continued)

(52) U.S. Cl.
CPC .......... *H01L 27/14621* (2013.01); *H04N 9/045* (2013.01); *H04N 5/332* (2013.01)
USPC .......................................... 348/278; 348/277

(58) Field of Classification Search
USPC .................................................. 348/277, 278
See application file for complete search history.

(56) References Cited

U.S. PATENT DOCUMENTS 3,971,065 A 7/1976 Bayer
4,630,307 A 12/1986 Cok
(Continued)

FOREIGN PATENT DOCUMENTS

EP 0472299 2/1992
EP 1729524 12/2006
JP 2007027604 1/2007

OTHER PUBLICATIONS

John Savard, Color Filter Array Designs, Feb. 19, 2006, Quadibloc, pp. 3 and 4.*

(Continued)

*Primary Examiner* — Sinh Tran
*Assistant Examiner* — Christopher K Peterson
(74) *Attorney, Agent, or Firm* — Byrne Poh LLP

(57) ABSTRACT

Generalized assorted pixel camera systems and methods are provided. In accordance with some embodiments, the generalized assorted pixel camera systems include a color filter array, where the color filter array includes a plurality of primary filters and a plurality of secondary filters. Each filter has a particular spectral response and each filter is formed on a corresponding pixel of a plurality of pixels. Each of the plurality of primary filters and the plurality of secondary filters enhances an attribute of image quality and the information obtained using the plurality of primary filters and the plurality of secondary filters is used to balance spectral resolution, dynamic range, and spatial resolution for generating an image of a plurality of image types.

38 Claims, 18 Drawing Sheets
(6 of 18 Drawing Sheet(s) Filed in Color)

(51) Int. Cl.
*H04N 9/04* (2006.01)
*H01L 27/146* (2006.01)
*H04N 5/33* (2006.01)

(56) References Cited

U.S. PATENT DOCUMENTS

| | | | |
|---|---|---|---|
| 5,373,322 A | 12/1994 | Laroche et al. | |
| 5,629,734 A | 5/1997 | Hamilton, Jr. et al. | |
| 5,789,737 A | 8/1998 | Street | |
| 5,828,793 A | 10/1998 | Mann | |
| 5,889,554 A | 3/1999 | Mutze | |
| 6,690,422 B1 * | 2/2004 | Daly et al. | 348/273 |
| 6,809,761 B1 | 10/2004 | Tamaru | |
| 6,922,209 B1 | 7/2005 | Hwang et al. | |
| 7,304,771 B2 * | 12/2007 | Walmsley et al. | 358/3.06 |
| 7,525,583 B2 | 4/2009 | Kimbell | |
| 7,612,822 B2 * | 11/2009 | Ajito et al. | 348/336 |
| 7,986,857 B2 * | 7/2011 | Kim et al. | 382/284 |
| 8,248,496 B2 * | 8/2012 | Sekine | 348/278 |
| 2003/0160875 A1 | 8/2003 | Kobayashi et al. | |
| 2006/0203100 A1 * | 9/2006 | Ajito et al. | 348/220.1 |
| 2007/0223059 A1 | 9/2007 | Oishi | |

OTHER PUBLICATIONS

Baone, G.A. and Qi, H., "Demosaicking Methods for Multispectral Cameras Using Mosaic Focal Plane Array Technology", In Proceedings of SPIE, the International Society for Optical Engineering, vol. 6062, 2006.

Ben-Ezra, M., "Segmentation with Invisible Keying Signal", In the Proceedings of the Conference on Computer Vision and Pattern Recognition, vol. 1, 2000, pp. 32-37.

Ben-Ezra, M., et al., "Penrose Pixels: Super-Resolution in the Detector Layout Domain", In IEEE International Conference on Computer Vision (ICCV), Oct. 14-21, 2007, pp. 1-8.

Chen, T., et al., "How Small Should Pixel Size Be?", In Proceedings of SPIE, vol. 3965, 2000, pp. 451-459.

Chi, C. and Ben-Ezra, M., "Spectral Probing: Multi-Spectral Imaging by Optimized Wide Band Illumination", In Proceedings of the First International Workshop on Photometric Analysis for Computer Vision (PACV 2007), Rio de Janeiro, Brazil, 2007.

European Office Action dated Feb. 14, 2012 in EU Patent Application No. 09724220.0, filed Mar. 27, 2009.

European Office Action dated Mar. 15, 2011 in EU Patent Application No. 09724220.0, filed Mar. 27, 2009.

Fife, K., et al., "A 0.5 μm Pixel Frame-Transfer CCD Image Sensor in 110nm CMOS", In IEEE International Electron Devices Meeting (IEDM 2007), Dec. 10-12, 2007, pp. 1003-1006.

Fife, K., et al., "A 3MPixel Multi-Aperture Image Sensor with 0.7μm Pixels in 0.11μm CMOS", In IEEE International Solid-State Circuit Conference (ISSCC) Digest of Technical Papers, Feb. 3-8, 2008.

Hirakawa, K. and Parks, T.W., "Adaptive Homogeneity-Directed Demosaicing Algorithm", In IEEE International Conference on Image Processing, vol. 3, Sep. 14-17, 2003, pp. 669-672.

International Preliminary Report on Patentability in International Application No. PCT/US2009/038510, filed Mar. 27, 2009, mailed Oct. 7, 2010.

International Search Report in International Patent Application No. PCT/US2009/038510, filed Mar. 27, 2009, mailed May 27, 2009.

Kapur, J.P., "Face Detection in Color Images", Technical Report (EE499), Department of Electrical Engineering, University of Washington, 1997.

Kimmel, R., "Demosaicing: Image Reconstruction from Color CCD Samples", In IEEE Transactions on Image Processing, vol. 8, No. 9, Sep. 1999, pp. 1221-1228.

Levin, A., et al., "Image and Depth from a Conventional Camera with a Coded Aperture", In ACM Transactions on Graphics (TOG), SIGGRAPH 2007, vol. 26, No. 3, Jul. 2007.

Lu, W. and Tan, Y.P., "Color Filter Array Demosaicking: New Method and Performance Measures", In IEEE Transactions on Image Processing, vol. 12, No. 10, Oct. 2003, pp. 1194-1210.

Lyon, R.F. and Hubel, P.M., "Eyeing the Camera: Into the Next Century", In the IS&T Reporter, vol. 17, No. 6, Dec. 2002, pp. 1-7.

Narasimhan, S.G. and Nayar, S.K., "Enhancing Resolution Along Multiple Imaging Dimensions Using Assorted Pixels", In IEEE Transactions on Pattern Analysis and Machine Intelligence (PAMI), vol. 27, No. 4, Apr. 2005, pp. 518-530.

Nayar, S.K., and Mitsunaga, T., "High Dynamic Range Imaging: Spatially Varying Pixel Exposures", In IEEE Conference on Computer Vision and Pattern Recognition (CVPR), vol. 1, 2000, pp. 472-479.

Ng, R., et al., "Light Field Photography with a Hand-Held Plenoptic Camera", In Stanford University Computer Science Technical Report (CSTR Feb. 2005), 2005.

Nyquist, H., "Certain Topics in Telegraph Transmission Theory", In Proceedings of the IEEE, vol. 90, No. 2, Feb. 2002, pp. 280-305.

Park, J.I., et al., "Multispectral Imaging Using Multiplexed Illumination", In Proceedings of the IEEE International Conference on Computer Vision (ICCV), 2007.

Parkkinen, J.P.S., et al., "Characteristic Spectra of Munsell Colors", In Journal of the Optical Society of America A: Optics, Image Science, and Vision, vol. 6, No. 2, Feb. 1989, pp. 318-322.

Quan, S., et al., "Unified Measure of Goodness and Optimal Design of Spectral Sensitivity Functions", In Journal of Imaging Science and Technology, vol. 46, No. 6, Nov./Dec. 2002, pp. 485-497.

Sharma, G. and Trussell, H.J., "Figures of Merit for Color Scanners", In IEEE Transactions on Image Processing, vol. 6, No. 7, Jul. 1997, pp. 990-1001.

Shogenji, R., et al., "Multispectral Imaging Using Compact Compound Optics", In Optics Express, vol. 12, No. 8, Apr. 19, 2004, pp. 1643-1655.

Veeraraghavan, A., et al., "Dappled Photography: Mask Enhanced Cameras for Heterodyned Light Fields and Coded Aperture Refocusing", In ACM Transactions on Graphics (TOG), SIGGRAPH 2007, vol. 26, No. 3, Jul. 2007, 69-1-12.

Written Opinion in International Patent Application No. PCT/US2009/038510, filed Mar. 27, 2009, mailed May 27, 2009.

Office Action dated Jul. 30, 2013 in Japanese Patent Application No. 2011-502091.

* cited by examiner

| B' | G' | E' | G' | B' | G' | E' | G' |
|----|----|----|----|----|----|----|----|
| G  | Y' | G  | R' | G  | Y' | G  | R' |
| E  | G' | B  | G' | E  | G' | B  | G' |
| G  | R  | G  | Y  | G  | R  | G  | Y  |
| B' | G' | E' | G' | B' | G' | E' | G' |
| G  | Y' | G  | R' | G  | Y' | G  | R' |
| E  | G' | B  | G' | E  | G' | B  | G' |
| G  | R  | G  | Y  | G  | R  | G  | Y  |

|   |   |   |   |   |   |   |   |   |
|---|---|---|---|---|---|---|---|---|
| G | R | G | Y | G | R | G | Y | G |
| B | G | E | G | B | G | E | G | B |
| G | Y | G | R | G | Y | G | R | G |
| E | G | B | G | E | G | B | G | E |
| G | R | G | Y | G | R | G | Y | G |
| B | G | E | G | B | G | E | G | B |
| G | Y | G | R | G | Y | G | R | G |
| E | G | B | G | E | G | B | G | E |
| G | R | G | Y | G | R | G | Y | G |

GENERALIZED ASSORTED PIXEL CAMERA SYSTEMS AND METHODS

CROSS REFERENCE TO RELATED APPLICATION

This application claims the benefit of U.S. Provisional Patent Application No. 61/072,301, filed Mar. 28, 2008 and U.S. Provisional Patent Application No. 61/194,725, filed Sep. 30, 2008, which are hereby incorporated by reference herein in their entireties.

NOTICE CONCERNING COLOR DRAWINGS

It is noted that the patent or application file contains at least one drawing executed in color. Copies of this patent or patent application publication with color drawings will be provided by the Office upon request and payment of the necessary fee.

Nonetheless, because some readers will not have the color drawings available, the description will also endeavor to describe the drawings and the images they depict in a color-neutral manner, which may create apparent redundancies of description.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The disclosed subject matter relates to generalized assorted pixel camera systems and methods.

BACKGROUND

Most digital cameras and camcorders have a single image sensor, such as a charge coupled device (CCD) image sensor or a complementary metal-oxide semiconductor (CMOS) image sensor. These image sensors use a color filter array or mosaic, which is an assortment of different spectral filters, formed in front of the CCD or CMOS image sensor for color acquisition.

A commonly-used color filter array or mosaic is the Bayer mosaic shown in FIG. 1. As shown, the Bayer mosaic includes color filters of the three primary colors red (R), green (G), and blue (B), where the green (G) color filters are arranged in a checkerboard pattern and the red (R) and blue (B) color filters are arranged in line sequence. One reason tri-chromatic filter arrays are used is that tri-chromatic sensing is near-sufficient in terms of colorimetric color reproducibility. It is also commonly assumed that this pixel assortment is the only practical approach for sensing color information with a semiconductor image sensor. However, the Bayer mosaic is limited in its capacity because it provides a limited amount of spectral information. That is, the Bayer mosaic provides spectral information for the three colors red (R), green (G), and blue (B). In addition, while interpolation and other techniques are available to fill in missing spectral information, these approaches typically provide a resulting image showing color aliasing and other artifacts. For example, FIG. 2 shows the differences between a ground truth image 210 and an image 220, which suffers from color aliasing and other artifacts resulting from a bicubic interpolation applied to signals captured using the Bayer mosaic. Dashed region 222 identifies the portion of image 220 that is affected by color aliasing and other artifacts.

In recent years, new image sensing technologies have emerged that use pixel assortments to enhance image sensing capabilities. For high dynamic range (HDR) imaging, a mosaic of neutral density filters with difference transmittances has been used. This approach to high sensitivity imaging builds upon the standard Bayer mosaic by using panchromatic pixels that collect a significantly larger proportion of incident radiation.

Despite these advances, the previously described mosaics and camera systems have limitations. For example, these mosaics and camera systems are used to generate one specific type of output image.

Accordingly, it is desirable to provide generalized assorted pixel camera systems and methods that overcome these and other deficiencies of the prior art.

SUMMARY

In accordance with various embodiments, generalized assorted pixel camera mechanisms are provided. In some embodiments, generalized assorted pixel camera systems and methods are provided that use a color filter array or mosaic with a rich assortment of color filters, such as the one shown in FIG. 4. A color filter array is used for an imaging or camera system in which one of a plurality of filters having different color separation characteristics (or colors) is bonded to each pixel. Each of the color filters in the color filter array can enhance a particular attribute of image quality. These attributes include, for example, color reproduction, spectral resolution, dynamic range, and sensitivity. By using the information captured by each of the filters in the color filter array, these generalized assorted pixel camera mechanisms allow a user to create a variety of image types (e.g., a monochrome image, a high dynamic range (HDR) monochrome image, a tri-chromatic (RGB) image, a HDR RGB image, and/or a multispectral image) from a single captured image.

In some embodiments, these mechanisms can provide an approach for determining the spatial and spectral layout of the color filter array, such as the one shown in FIG. 4. For example, generalized assorted pixel camera systems and methods are provided that use a cost or error approach to balance variables relating to colorimetric and spectral color reproduction, dynamic range, and signal-to-noise ratio (SNR).

In some embodiments, these mechanisms can provide a demosaicing approach for reconstructing the variety of image types. For example, generalized assorted pixel camera systems and methods are provided that include submicron pixels and anti-aliasing approaches for reconstructing under-sampled channels. In particular, information from particular filters is used to remove aliasing from the information captured by the remaining filters.

It should be noted that these mechanisms can be used in a variety of applications. For example, these mechanisms for enhancing spatial and spectral layout of a color filter array can be used in a generalized assorted pixel camera system. The camera system can capture a single image and, using the information from each of the filters in the color filter array, to balance or trade-off spectral resolution, dynamic range, and spatial resolution for generating images of multiple image types. These image types can include, for example, a monochrome image, a high dynamic range (HDR) monochrome image, a tri-chromatic (RGB) image, a HDR RGB image, and/or a multispectral image) from a single captured image.

In accordance with some embodiments, a color filter array is provided, the array comprising: a plurality of primary filters and a plurality of secondary filters, wherein each filter has a particular spectral response and each filter is formed on a corresponding pixel of a plurality of pixels; and wherein each of the plurality of primary filters and the plurality of secondary filters enhances an attribute of image quality and wherein the information obtained using the plurality of primary filters and the plurality of secondary filters is used to balance spatial resolution and image quality for generating an image of a plurality of image types.

In accordance with some embodiments, a method for generating images is provided, the method comprising: providing a color filter array, the color filter array comprising: a plurality of primary filters and a plurality of secondary filters, wherein each filter has a particular spectral response and each filter is formed on a corresponding pixel of a plurality of pixels; and wherein each of the plurality of primary filters and the plurality of secondary filters enhances an attribute of image quality and wherein the information obtained using the plurality of primary filters and the plurality of secondary filters is used to balance spatial resolution and image quality for generating an image of a plurality of image types; capturing an image using the color filter array, wherein information from the plurality of primary filters and the plurality of secondary filters corresponding to the image is obtained; and generating the image in a plurality of image types using the information from the plurality of primary filters and the plurality of secondary filters.

In accordance with some embodiments, a camera system is provided, the system comprising: a color filter array, the color filter array comprising: a plurality of primary filters and a plurality of secondary filters, wherein each filter has a particular spectral response and each filter is formed on a corresponding pixel of a plurality of pixels; and wherein each of the plurality of primary filters and the plurality of secondary filters enhances an attribute of image quality and wherein the information obtained using the plurality of primary filters and the plurality of secondary filters is used to balance spatial resolution and image quality for generating an image of a plurality of image types.

In some embodiments, an image processing system is provided, the system comprising: a processor that is configured to: receive information corresponding to an image from a color filter array, wherein the color filter array includes a plurality of primary filters and a plurality of secondary filters, wherein each filter has a particular spectral response and each filter is formed on a corresponding pixel of a plurality of pixels and wherein each of the plurality of primary filters and the plurality of secondary filters enhances an attribute of image quality and wherein the information obtained using the plurality of primary filters and the plurality of secondary filters is used to balance spatial resolution and image quality for generating an image of a plurality of image types; and generate the image in a plurality of image types using the information from the plurality of primary filters and the plurality of secondary filters.

BRIEF DESCRIPTION OF THE DRAWINGS

FIG. 13 illustrates an 8×8 color filter array that includes five different color filters (Green (G), Red (R), Blue (B), Yellow (Y), and Emerald (E)), where each color filter has two exposures (a bright exposure and a dark exposure), in accordance with some embodiments of the disclosed subject matter.

FIG. 15 illustrates a 9×9 color filter array that includes five different color filters (Green (G), Red (R), Blue (B), Yellow (Y), and Emerald (E)) in accordance with some embodiments of the disclosed subject matter.

DETAILED DESCRIPTION

In accordance with various embodiments, generalized assorted pixel camera mechanisms are provided. In some embodiments, generalized assorted pixel camera systems and methods are provided that use a color filter array or mosaic with a rich assortment of color filters, such as the one shown in FIG. 4. A color filter array is used for an imaging or camera system in which one of a plurality of filters having different color separation characteristics (or colors) is bonded to each pixel. Each of the color filters in the color filter array can enhance a particular attribute of image quality. These attributes include, for example, color reproduction, spectral resolution, dynamic range, and sensitivity. By using the information captured by each of the filters in the color filter array, these generalized assorted pixel camera mechanisms allow a user to create a variety of image types (e.g., a monochrome image, a high dynamic range (HDR) monochrome image, a tri-chromatic (RGB) image, a HDR RGB image, and/or a multispectral image) from a single captured image.

Figure 4:
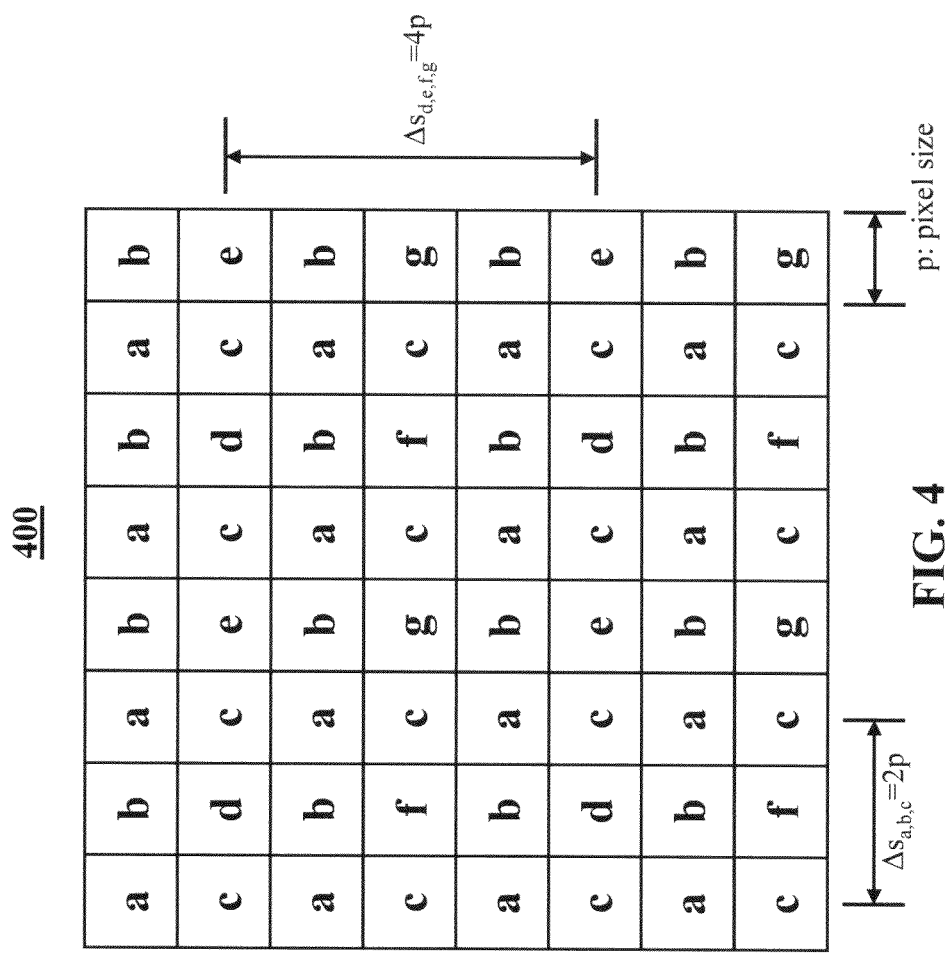
FIG. 4 illustrates a color filter array or arrangement in accordance with some embodiments of the disclosed subject matter.

In some embodiments, these mechanisms can provide an approach for determining the spatial and spectral layout of the color filter array, such as the one shown in FIG. 4. For example, generalized assorted pixel camera systems and methods are provided that use a cost or error approach to balance variables relating to colorimetric and spectral color reproduction, dynamic range, and signal-to-noise ratio (SNR).

In some embodiments, these mechanisms can provide a demosaicing approach for reconstructing the variety of image types. For example, generalized assorted pixel camera systems and methods are provided that include submicron pixels and anti-aliasing approaches for reconstructing undersampled channels. In particular, information from particular filters is used to remove aliasing from the information captured by the remaining filters.

It should be noted that these mechanisms can be used in a variety of applications. For example, these mechanisms for enhancing spatial and spectral layout of a color filter array can be used in a generalized assorted pixel camera system. The camera system can capture a single image and, using the information from each of the filters in the color filter array, balance or trade-off spectral resolution, dynamic range, and spatial resolution for generating images of multiple image types. These image types can include, for example, a monochrome image, a high dynamic range (HDR) monochrome image, a tri-chromatic (RGB) image, a HDR RGB image, and/or a multispectral image) from a single captured image.

In some embodiments, generalized assorted pixel camera mechanisms with an image sensor having submicron pixels are provided. Generally speaking, it has been determined that the resolution performance of an imaging sensor with submicron pixels exceeds the optical resolution limit.

To fabricate such a camera system, it should be noted that the resolution of an optical imaging system can be limited by multiple factors, such as diffraction and aberration. While aberrations can be corrected during lens design, diffraction is a limitation that cannot be avoided. The two-dimensional diffraction pattern of a lens with a circular aperture is generally referred to as the Airy disk, where the width of the Airy disk determines the maximum resolution limit of the system. This is generally defined as:

$$I(\theta) = I_0 \{2J_1(z)/z\}^2.$$

where $I_0$ is the intensity in the center of the Airy diffraction pattern, $J_1$ is the Bessel function of the first kind of order one, and $\theta$ is the angle of observation (i.e., the angle between the axis of the circular aperture and the line between the aperture center and observation point). It should be noted that $z=\pi q/\lambda N$, where q is the radial distance from the optical axis in the observation plane, $\lambda$ is the wavelength of the incident light, and N is the f-number of the system. In the case of an ideal lens, this diffraction pattern is the Point Spread Function (PSF) for an in-focus image and the Fourier transformation of the PSF is used to characterize the resolution of an optical imaging system. This quantity is generally referred to as the Modulation Transfer Function (MTF). The MTF of such an imaging system can be calculated directly from the wavelength $\lambda$ of incident light and the f-number N. This is denoted by $\text{MTF}_{opt}(\lambda, N) = F(I(\theta))$, where $F(\bullet)$ denotes the Fourier transformation.

It should be noted that pixels generally have a rectangular shape and their finite size contributes to the resolution characteristics of the imaging system. The Modulation Transfer Function (MTF) of an image sensor can be approximated as the Fourier transformation of a rectangular function, which is described by $\text{MTF}_{sensor}(p) = F(s(t))$. The rectangular function s(t) can be expressed as:

$$s(t) = \begin{cases} 1 & |t| \leq \dfrac{p\zeta}{2} \\ 0 & |t| > \dfrac{p\zeta}{2} \end{cases}$$

where p is the pixel size and $\zeta$ is an aperture ratio, which is generally assumed to be 1 due to the use of on-chip microlenses.

It should also be noted that the total fundamental optical resolution limit of a camera system (e.g., including the lens and the sensor) can be described in the frequency domain as $\text{MTF} = \text{MTF}_{opt}(\lambda, N) \cdot \text{MTF}_{sensor}(p)$. To calculate this, the values of $\lambda = 555$ nm (which generally corresponds to the peak of the sensitivity of the human eye) and N=f/5.6 (which is a pupil size generally used in, for example, consumer photography) are used. With these values, the fundamental MTF is determined by pixel size p.

Figure 1:
FIG. 1 illustrates an example of a Bayer mosaic.
Figure 2:
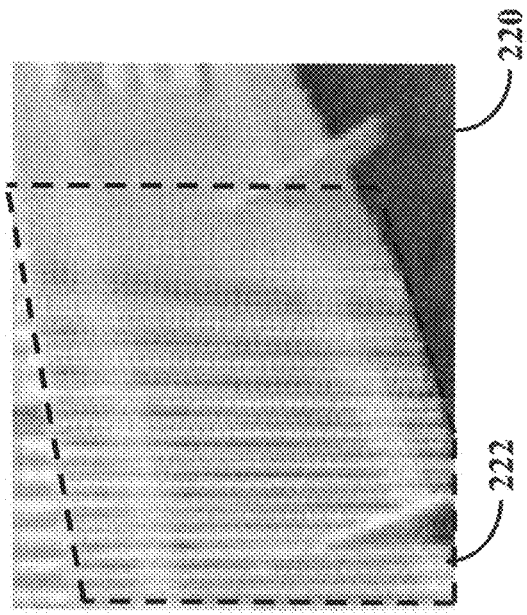
FIG. 2 illustrates the differences between a ground truth image and an image showing color aliasing and other artifacts resulting from a bicubic interpolation applied to signals captured using the Bayer mosaic of FIG. 1 in accordance with some embodiments of the disclosed subject matter.
Figure 2:
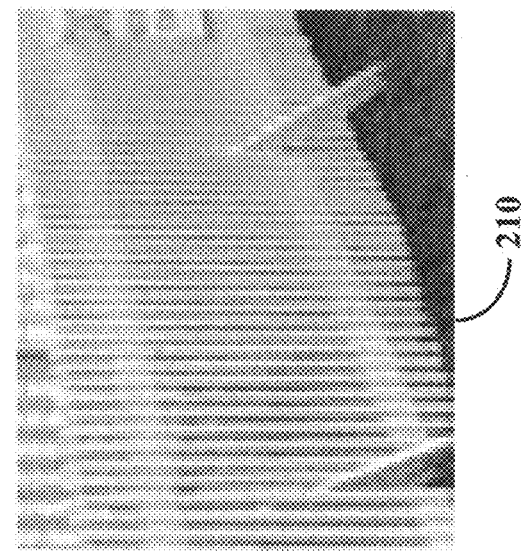
Figure 3:
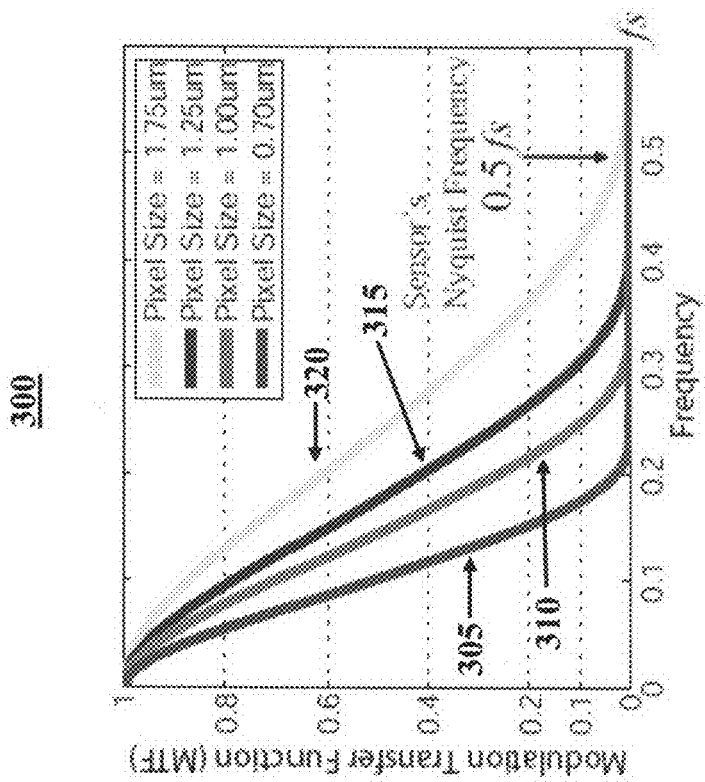
FIG. 3 illustrates the Modulation Transfer Function (MTF) calculated for various pixel sizes in accordance with some embodiments of the disclosed subject matter.

The MTF for various pixel sizes is shown in FIG. 3. As shown, the MTF is calculated for pixel sizes of 0.70 μm (represented by the leftmost curve 305), 1.00 μm (represented by curve 310), 1.25 μm (represented by curve 315), and 1.75 μm (represented by the rightmost curve 320). The MTF with a pixel size p=1.00 μm is about 0.1 at 0.25 fs, where fs is the image sensor's sampling frequency. It should be noted that the human eye cannot recognize contrast when the MTF is less than 0.1. It should also be noted that the optical resolution limit of an image sensor with p=1.00 μm pixel size is half of the image sensor's Nyquist frequency. Accordingly, FIG. 3 shows that the resolution performance of a sensor with sub-micron pixels exceeds the optical resolution limit.

In some embodiments, generalized assorted pixel camera systems and methods are provided that use a color filter array or mosaic with a rich assortment of color filters. Again, as shown in FIG. 3, for a 1.0 μm pixel size, the combined MTF, due to diffraction from the lens aperture and averaging by pixels, leads to an optical resolution limit of about one-quarter of the sampling frequency fs, where fs=1/Δs and Δs is the sampling pitch. To exploit this, an exemplary color filter array or arrangement 400 in accordance with some embodiments is shown in FIG. 4. As described previously, a color filter array is used for an imaging or camera system in which one of a plurality of filters having different color separation characteristics (or colors) is bonded to each pixel. It should be noted that the term "color" generally refers to a filter or a pixel value of that color obtained from the filter. As shown in FIG. 4, color filter array 400 includes primary filters (i.e., color filters a, b, and c) and secondary filters (i.e., color filters d, e, f, and g).

The pixels marked a, b, and c in color filter array 400 (collectively referred to herein as "primary filters") capture three different spectral images on a rectangular grid with sampling pitch $\Delta s_{a,b,c}=2p$. Accordingly, the Nyquist frequency for a, b, and c is $fn_{a,b,c}=fs_{a,b,c}/2=fs/4$. It should be noted that, due to diffraction, filters a, b, and c do not cause aliasing because the optical resolution limit is one-quarter of the sampling frequency fs. These aliasing-free pixels a, b, and c can be used to reconstruct high resolution images, such as high resolution monochrome images and high resolution RGB images.

The pixels marked d, e, f, and g in color filter array 400 (collectively referred to as "secondary filters") each sample the incident image on rectangular grids through different spectral filters. The sampling pitch for each of the secondary filters is $\Delta s_{d,e,f,g}=4p$ and the Nyquist frequency is $fn_{d,e,f,g}=fs_{d,e,f,g}/2=fs/8$.

Figure 5:
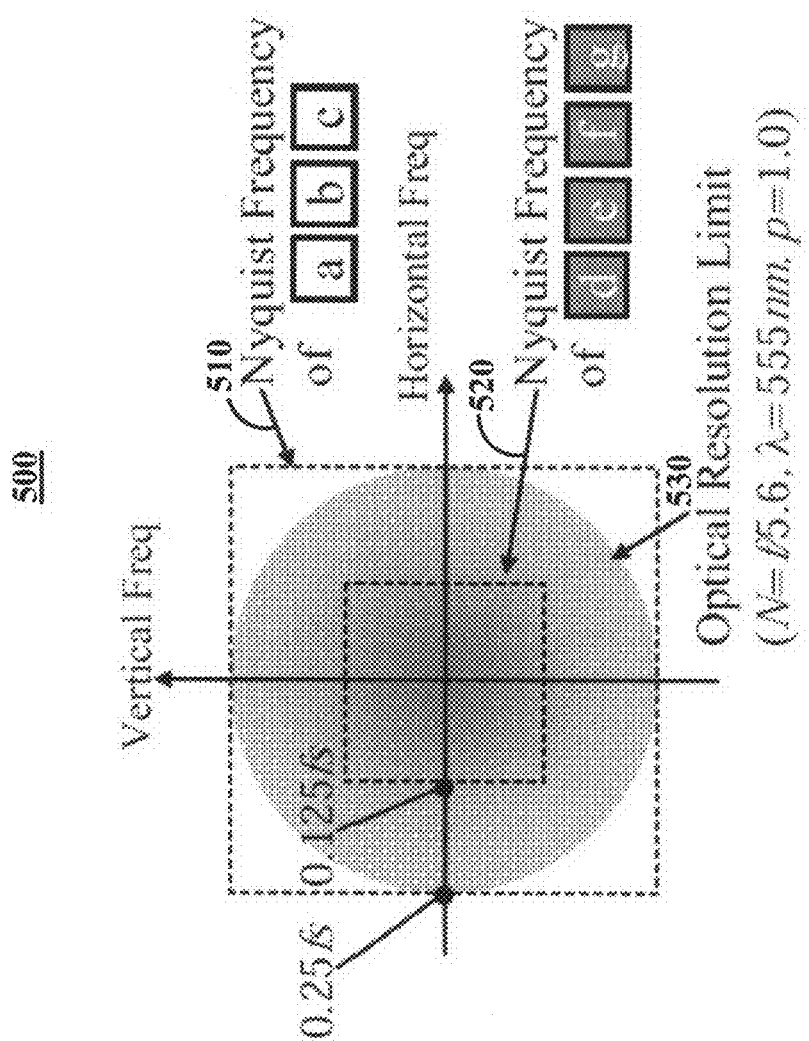
FIG. 5 illustrates the Nyquist or usable frequency region of the color filter array shown in FIG. 4 and the optical resolution limit for submicron pixels in accordance with some embodiments of the disclosed subject matter.

To further illustrate the Nyquist frequencies of color filter array 400, the Nyquist or usable frequency region 500 is shown in FIG. 5. As shown, the Nyquist region of the primary filters is located in a substantially square portion of the frequency space indicated by dashed line 510 and the Nyquist region of the secondary filters is located in a substantially square portion of the frequency space indicated by a dashed line 520.

In addition, FIG. 5 also illustrates the optical resolution limit for submicron pixels, as described above, that is shown by shaded area 530. It should be noted that, as the Nyquist frequencies for the secondary filters (indicated by dashed line 520) are lower than the optical resolution limit, the possibility of aliasing artifacts is introduced. However, as shown herein, these aliasing artifacts can be removed by using high frequency information from the demosaiced image obtained using the primary filters.

Using color filter array 400, a plurality of image characteristics can be captured simultaneously. It should be noted, however, that there may be a trade-off in the fidelity of each characteristic. For example, monochrome and standard RGB images are reconstructed at high resolution using the primary filters of color filter array 400. For high dynamic range (HDR) images, the spectral resolution is improved by using the secondary filters and decreasing the spatial resolution.

In another example, high spatial resolution can be obtained by sacrificing the dynamic range and the spectrum. That is, a monochrome image has high spatial resolution. By sacrificing the spatial resolution, quality of the spectrum is improved. By further sacrifice of the resolution, dynamic range is expanded in addition to the improvement of the spectrum.

In some embodiments, a cost or error function can be used to enhance the filter spectra for the primary and secondary filters. The cost function can incorporates several terms, such as the quality of color reproduction (e.g., for a RGB image), reconstruction of reflectance (e.g., for a multispectral image), and dynamic range (e.g., for a HDR image).

The value $x_m$, measured at a pixel in the $m^{th}$ channel, where m is one of the primary or secondary filters a, b, c, d, e, f, or g, is given by the following equation:

$$x_m = \int_{\lambda_{min}}^{\lambda_{max}} i(\lambda) r(\lambda) c_m(\lambda) d\lambda,$$

where $i(\lambda)$ is the spectral power distribution of the illumination, $r(\lambda)$ is the spectral reflectance of the scene point, and $c_m(\lambda)$ is the spectral response of the camera's $m^{th}$ color channel. When the wavelength $\lambda$ is sampled at equally-spaced L points, $x_m$ can be described by the following discrete expression:

$$x_m = \sum_{l=1}^{L} i(\lambda_l) r(\lambda_l) c_m(\lambda_l)$$

Moreover, if the above-mentioned equation is rewritten in matrix form, it can be described as $X=C^T IR$, where $X=[x_a, x_b, \ldots x_g]^T$, $C=[c_m(\lambda_l)]$, I is a diagonal matrix made up of the discrete illumination samples $i(\lambda_l)$, and $R=[r(\lambda_l)]$.

In some embodiments, the color reproduction error corresponding to the primary and secondary filters can be determined. For example, to obtain HDR RGB images, a high exposure RGB image can be reconstructed using the primary filters of color filter array 400 and a lower exposure image can be reconstructed using the secondary filters of color filter array 400. In some embodiments, the spectral responses of the primary and secondary filters are to yield the highest color reproduction. It should be noted that a variety of color rating indicies can be used to evaluate the color reproduction characteristics of a filter and these indicies can use a cost function that minimizes the difference in the color between the measured color of a reference material and its known color.

In some embodiments, to calculate the difference of color, the CIE 1931 XYZ color space (created by the International Commission on Illumination), which is based on direct measurements of human visual perception and serves as the basis of which many other color spaces are defined, can be used. The calculation of sRGB tristimulus values (which are employed in some digital cameras or color monitors) from the CIE XYZ tristimulus values is a linear transformation. The CIE XYZ tristimulus values can be defined as $Y=A^T IR$, where Y represents the true tristimulus values and A is a matrix of CIE XYZ color matching functions $[\bar{x}\,\bar{y}\,\bar{z}]$. The estimated CIE tristimulus values corresponding to the primary filters $\hat{Y}'$ can be expressed as an optimal linear transformation: $\hat{Y}'=T'X'$, where $X'=[x_a, x_b, x_c]^T$. The transformation T' is determined so as to minimize the color difference: $\|Y-T'X'\|^2$. Similarly, the estimated CIE tristimulus values corresponding to the secondary filters $\hat{Y}''$ can be expressed as $\hat{Y}''=T''X''$, where $X''=[x_d, x_e, x_f, x_g]^T$.

It should be noted that the average magnitude of color difference between the true color Y and the estimate $\hat{Y}$ over a set of N real-world objects can be used as a metric to quantify the camera system's color reproduction performance. The color reproduction errors corresponding to the primary and secondary filters can then be described by the following equations:

$$E'(C) = \min_{T'} \sum_{n=1}^{N} \|Y_n - T' X'_n\|^2$$

$$E''(C) = \min_{T''} \sum_{n=1}^{N} \|Y_n - T'' X''_n\|^2$$

In some embodiments, the error introduced by the reconstruction of the spectral distribution can be determined. For example, the spectral distribution can be reconstructed using a linear model. Since the model is linear, the reconstruction is efficient and stable. The linear model for the reconstruction can be expressed as the set of orthogonal spectral basis functions $b_k(\lambda)$:

$$r(\lambda) = \sum_{k=1}^{K} \sigma_k b_k(\lambda),$$

where $\sigma_k$ are scalar coefficients and K is the number of basis functions. By substituting the above-described equation into the cost function, the cost or error function can be described by the following equation:

$$x_m = \sum_{k=1}^{K} \sigma_k \int_{\lambda_{min}}^{\lambda_{max}} b_k(\lambda)i(\lambda)c_m(\lambda)d\lambda$$

These equations can be written as X=F·σ, where F is a M×K matrix: $F=\int_{\lambda_{min}}^{\lambda_{max}} b_k(\lambda)i(\lambda)c_m(\lambda)d\lambda$, is the number of color filter channels (for example, color filter array 400 of FIG. 4 has seven channels, so, M=7), and σ=[$\sigma_k$]. The spectral distribution is reconstructed by minimizing $\|F\cdot\sigma-X\|^2$. It should be noted that the spectral reflectance of most materials is known to be smooth and is generally positive. Accordingly, the reconstruction approach can be expressed as a constrained minimization as follows:
$\hat{\sigma}$=arg min$\|\tilde{F}\cdot\sigma-\tilde{X}\|^2$, subject to B·σ≥0, where $\tilde{F}=[F^T \ \alpha P^T]^T$, $P_{lk}=\partial^2 b_k(\lambda_l)/\partial\lambda^2$ is a smoothness constraint, α is a smoothness parameter, 1≥L, 1≥k≥K, $\tilde{X}=[X^T \ 0]^T$, and B=[$b_k(\lambda_1)$]. This regularized minimization can be solved using quadratic programming. The multispectral image's mean squared reconstruction error R(C) can then be expressed as:

$$R(C) = \sum_{n=1}^{N} \|\sigma_n - \hat{\sigma}_n\|^2$$

where $\sigma_n$ represents the actual coefficients of the $n^{th}$ object and $\hat{\sigma}_n$ are the reconstructed coefficients. It should be noted that, in some embodiments, the number of basis functions K is 8 and the smoothness parameter α is set to 64.0.

In some embodiments, the cost function can include an approach for balancing the extension of dynamic range with signal-to-noise (SNR) ratio. As described previously, to achieve HDR imaging, secondary filters (e.g., filters d, e, f, and g of color filter array 400) have lower transmittances than the primary filters (e.g., filters a, b, and c of color filter array 400). This can cause deterioration of signal-to-noise ratio (SNR) for the secondary filters. Such a trade-off can be controlled based on the ratio of the exposures of the primary and secondary filters: $\beta=e_{max}/e_{min}$, where $e_{max}$ is the average exposure of the primary filters and $e_{min}$ is the average exposure of the secondary filters. Accordingly, β can be determined by C from the previously-mentioned equation X=$C^T$IR, where the determined value of β can be used to valance the extension of dynamic range versus the reduction of the signal-to-noise ratio.

In some embodiments, dynamic range can be defined as:

$$DR = 20 \log_{10} \frac{V_{full}}{N_r},$$

where $V_{full}$ represents the full-well capacity of the detector (e.g., $V_{full}$=3500e$^-$) and $N_r$ is the root mean square (RMS) of the read-noise of the image sensor. The RMS of the read-noise of the detector can be defined as $N_r=\sqrt{N_{shot}^2+N_{dark}^2}$. For example, $N_{dark}$ can be set to 33e$^-$. In some embodiments that use the color filter array 400 of FIG. 4, it should be noted that $N_r$ does not change, but the maximum detectable gray level becomes $\beta V_{full}$. Accordingly, the dynamic range of a camera system using color filter array 400 can be expressed as follows:

$$DR_{GAP} = 20 \log_{10} \frac{\beta V_{full}}{N_r}$$

In some embodiments, the signal-to-noise ration can be defined as:

$$SNR = 20 \log_{10} \frac{V}{N},$$

where V is the signal and N is the noise. The signal corresponding to a secondary filter can be express using the exposure β as $V_{max}"=V_{max}'/\beta$, where $V_{max}'$ is a signal due to a primary filter. When the signal due to the primary filter is not saturated, the signal due to the secondary filter can be determined from the primary signal. The signal-to-noise ratio for a secondary filter when the primary signal is saturated is the worst-case signal-to-noise ratio for a camera system using mosaic 400:

$$SNR_{GAP} = 20 \log_{10} \frac{V_{full}/\beta}{N_{max}}$$

where $N_{max}=\sqrt{N_{shot}"^2+N_{dark}^2}$ and $N_{shot}"=\sqrt{V_{full}/\beta}$.

Because the camera system has a high performance in signal-to-noise ratio and dynamic range when $SNR_{GAP}$ and $DR_{GAP}$ are large, the following cost function can be used:

$$D(C) = \frac{1}{DR_{GAP}} \cdot \frac{1}{SNR_{GAP}}$$

In some embodiments, each of the above-mentioned cost functions can be combined to provide a total cost function. For example, since each of the above-mentioned cost functions represent a particular dimension of image quality, the total cost function can be expressed as a weighted sum of the individual costs:

$$G=w_1\{E'+E"\}+w_2R+w_3D$$

It should be noted that the weights (e.g., $w_1$, $W_2$, and $w_3$) can be determined according to the image quality requirements of the application for which the camera system is used or manufactured. For example, in some embodiments, $w_1$=1.0, $w_2$=1.0, and $w_3$=1.0 can be used for determining the total cost function. It should also be noted that, since the filters have positive spectral responses (C is to be positive), the enhancement or optimization of C can be expressed as:

$$C = \arg\min_C G, \text{ subject to } C \geq 0$$

In some embodiments, initial guesses can be assigned to the filter spectral responses. That is, to find the seven spectral response functions in C, initial guesses can be used along with an optimization approach. In one example, the initial guesses for the filter responses can be selected from a set of commercially available optical band pass filters and on-chip filters. In another example, commercial filters can be assigned to each of the seven channels based on one or more of the above-mentioned cost functions (e.g., assigning from a set of 177 commercial filters based on color reproduction error). Accordingly, the primary filters $C_0'$ and secondary filters $C_0''$ are determined such that:

$$\min_{C_0'} E(C_0') \quad (C_0' \in C_0)$$

$$\min_{C_0''} E(C_0'') \quad (C_0'' \in C_0)$$

where $C_0$ is the set of commercial filters.

In response to assigning seven initial guesses to each of the seven filters, an iterative application can be used to perform a constrained non-linear minimization of C=arg $\min_c$G. For example, Mathworks® Matlab® or any other suitable computing program can be used to determine the spectral responses. Using Matlab®, the FMINCON routine can be used to find a minimum of a constrained non-linear multivariable function as described above. However, any other suitable computer program can be used to find the minimum of a constrained non-linear multivariate function.

Figure 6:
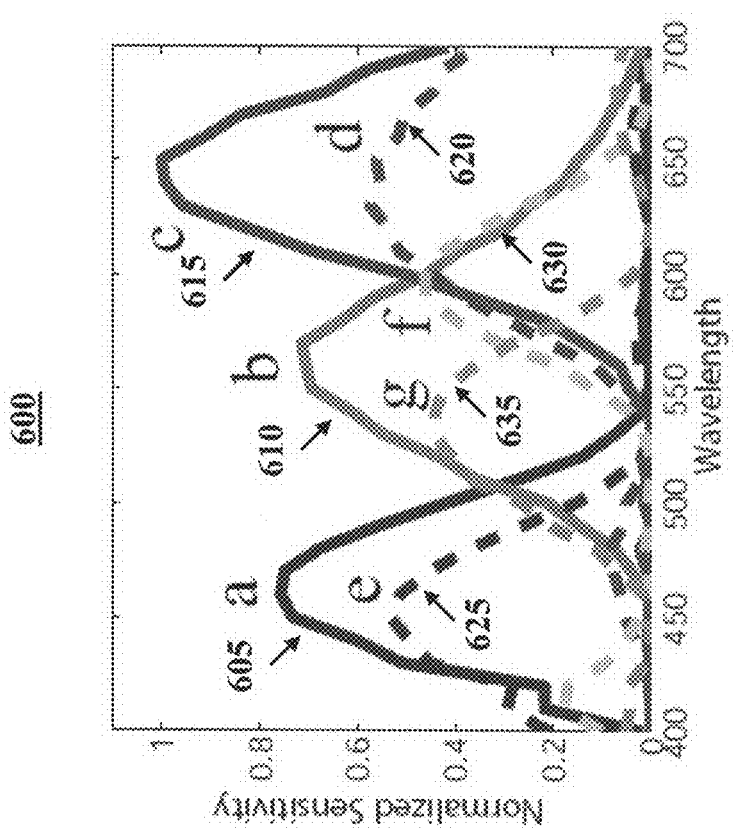
FIG. 6 illustrates the spectral responses of the seven enhanced filters (e.g., filters a, b, c, d, e, f, and g) in the color filter array of FIG. 4 in accordance with some embodiments of the disclosed subject matter.

FIG. 6 illustrates the spectral responses of the seven enhanced filters in color filter array 400 of FIG. 4. By using the cost function to determine the spectral responses and as a result of the color reproduction term in the cost function, it should be noted that the primary filters a, b, and c represented by curves 605, 610, and 615, respectively, have spectral responses substantially similar to red, green, and blue filters. Accordingly, the primary filters can be used to obtain RGB images, which essentially cover the entire visible light spectrum.

In addition, the spectra captured by the secondary filters d, e, f, and g (represented by curves 620, 625, 630, and 635, respectively), irrespective of their spectral responses, are to be highly correlated with the images obtained using the primary filters. Consequently, anti-aliasing of images produced by secondary filters can be performed. Furthermore, due to the characteristics of the cost function, the secondary filters have lower exposures or transmittances than primary filters. Accordingly, using the primary and secondary filters, high dynamic range information can be obtained and, since the seven filters have different spectra and sample the visible spectrum, their reconstructed images can be used to obtain smooth estimates of the complete spectral distribution of each scene point a multispectral image.

As shown in Table 1 below, the errors in the color reproduction and spectral reconstruction components of the total cost function, the estimated dynamic range, and the signal-to-noise ratio of the initial and enhanced set of seven filters of color filter array 400. In addition, Table 1 also illustrates the errors in the color reproduction and spectral reconstruction components of the total cost function, the estimated dynamic range, and the signal-to-noise ratio for the red, green, and blue filters in a Bayer mosaic.

TABLE 1

| Optimization accuracy | | | |
|---|---|---|---|
| | Initial filters | Enhanced filters | Bayer filters |
| ΔE' (C) | 0.0497 | 0.0429 | 0.0490 |
| ΔE'' (C) | 0.0100 | 0.0055 | N/A |
| ΔR (C) | 0.0624 | 0.0610 | 0.0709 |
| $DR_{GAP}$ | 58.2970 | 62.9213 | 56.9020 |
| $SNR_{GAP}$ | 34.7069 | 32.3694 | 35.4098 |

It should be noted that, in response to enhancing the spectral responses of the filters in the generalized assorted pixel color filter array using a cost function, each of the errors in Table 1 have been reduced. It should also be noted that the deterioration of the signal-to-noise ratio is kept low at about 2.3 dB, while the dynamic range is improved by about 4.6 dB. It should further be noted that the errors in color reproduction and spectral reconstruction components of the total cost function are higher with the Bayer mosaic.

Figure 7:
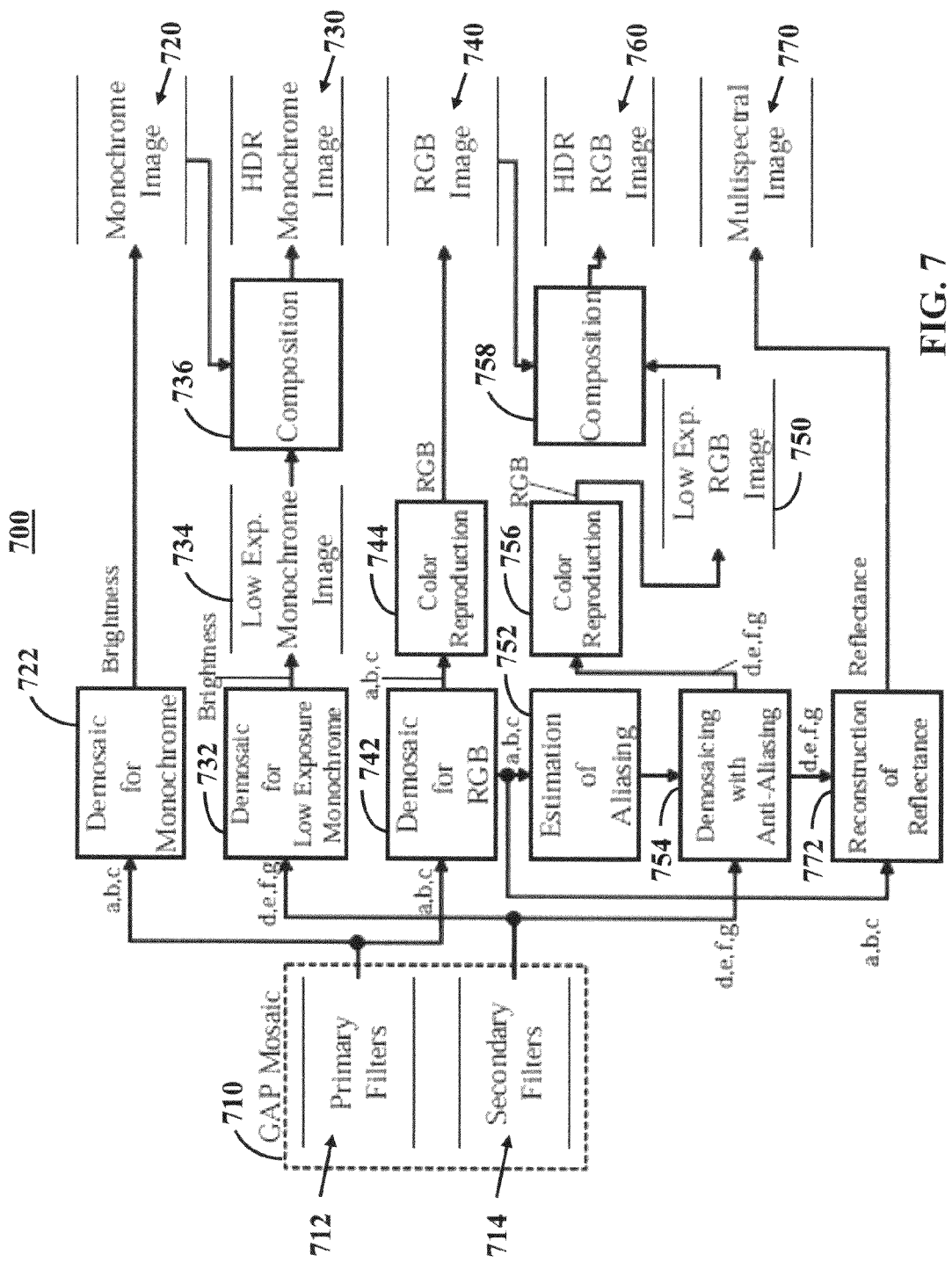
FIG. 7 is a schematic diagram of a system for creating multiple image types from a single captured image using a camera system with a color filter array, such as the one shown in FIG. 4, in accordance with some embodiments of the disclosed subject matter.

FIG. 7 shows a schematic diagram of a system 700 for creating multiple image types from a single captured image using a camera system with a color filter array in accordance with some embodiments of the disclosed subject matter.

As shown in FIG. 7, camera system 700 includes a color filter array 710 that includes primary filters 712 and secondary filters 714. As described previously, color filter array 710 can be similar to color filter array 400 of FIG. 4, where primary filters 712 include three color filters a, b, and c and secondary filters 714 include four color filters d, e, f, and g. The primary filters capture three different spectral images on a rectangular grid with sampling pitch $\Delta s_{a,b,c} = 2p$, while the secondary filters each sample the incident image on rectangular grids with sampling pitch $\Delta s_{d,e,f,g} = 4p$ through different spectral filters.

As also shown in FIG. 7, information obtained from the primary filters 712 and secondary filters 714 can be used to generate multiple types of images, such as a monochrome image 720, a high dynamic range (HDR) monochrome image 730, a tri-chromatic (RGB) image 740, a HDR RGB image 760, and a multispectral image 770. In some embodiments, a multimodal demosaicing approach with anti-aliasing is applied to generate high resolution images.

Referring back to the color filter array 400 of FIG. 4, note that there is one color measurement at each pixel. The other colors are estimated from information obtained by neighboring pixels in order to, for example, reproduce high resolution output images irrespective of the type of image (e.g., monochrome image, HDR monochrome image, RGB image, HDR RGB image, multispectral image, etc.). This approach is generally referred to as "demosaicing."

Denoting $\Lambda_m$ as the set of pixel locations, (i,j), for channel $m \in \{a, b, d, e, f, g\}$, a mask function for each filter can be defined as:

$$W_m(i, j) = \begin{cases} 1 & (i, j) \in \Lambda_m \\ 0 & \text{otherwise} \end{cases}$$

In the color filter array 400 of FIG. 4 or color filter array 710 of FIG. 7, there are seven types of color channels—i.e., a, b, c, d, e, f, and g. Accordingly, the observed data, y(i,j), can be expressed as:

$$y(i, j) = \sum_{m=a,b,c,d,e,f,g} W_m(i, j) x_m(i, j)$$

where $x_m$ is the mth channel's full resolution image.

Referring back to FIG. 7, monochrome image 720 can be generated from a single captured image by using information obtained from primary filters 712. As described previously, information captured by primary filters 712 do not suffer from aliasing. Accordingly, at 722, missing information for one of the primary filters 712 can be estimated using linear interpolation from other primary filters 712 from color filter array 710.

Monochrome image 720 of a high resolution can be reconstructed using information measured by primary filters. This can be expressed as:

$$I_M(i,j) = \{\hat{x}_a(i,j) + \hat{x}_b(i,j) + \hat{x}_c(i,j)\}/3$$

where $\hat{x}_a(i,j)$, $\hat{x}_b(i,j)$, $\hat{x}_c(i,j)$ are the full resolution images obtained by interpolating pixels with the primary filters (e.g., primary filters a, b, and c of FIG. 4). For interpolation, a Finite Impulse Response (FIR) Filters F(i,j) can be used and can be expressed as follows:

$$\hat{x}_v(i,j) = W_v(i,j)y(i,j) + \overline{W}_v(i,j)[F(i,j)*y(i,j)]$$

where v=a, b, or c, * denotes convolution, and $\overline{W}_v(i,j) = 1 - W(i,j)$. For example, in some embodiments, the fir 1 function in Mathworks® Matlab® can be used to find FIR filters of size 30×30 that pass all frequencies, thereby minimizing the loss of high frequencies due to interpolation.

In some embodiments, high dynamic range monochrome image 730 can be generated from a single captured image by using information obtained from primary filters 712 and secondary filters 714. To create a high dynamic range monochrome image (e.g., image 730), a low exposure monochrome image 732 can be constructed. At 734, low exposure monochrome image 732 is constructed using information from secondary filters 714 (e.g., the four secondary filters d, e, f, and g of FIG. 4). These secondary filters 714 have lower exposure and collectively cover the whole visible spectrum.

For example, the monochrome values at pixels with filter a (e.g., filter a of color filter array 400 shown in FIG. 4) can be calculated. As shown in FIG. 4, color filter array 400 includes four different secondary pixels (e.g., pixels d, e, f, and g) arranged diagonally about each pixel a. Accordingly, the monochrome value at each pixel a can be calculated as the average of the measurements at the four neighboring secondary pixels and can be expressed as:

$$W_a(i,j)\{Q_D * y(i,j)\},$$

where $$Q_D = \begin{pmatrix} \frac{1}{4} & 0 & \frac{1}{4} \\ 0 & 0 & 0 \\ \frac{1}{4} & 0 & \frac{1}{4} \end{pmatrix}$$

It should be noted that aliasing caused by half-pixel phase shifts cancel out when adding four pixels in a diagonal neighborhood. The values at pixel a are then interpolated to the other pixels to yield the low exposure monochrome image 732 ($I_{LEM}$), which can be expressed as:

$$I_{LEM}(i,j) = L(i,j) + W_S\{Q_D*L(i,j)\} + W_b\{Q_H*L(i,j)\} + W_c\{Q_V*L(i,j)\}$$

where:

$$W_S(i,j) = \begin{cases} 1 & (i,j) \in \{d,e,f,g\} \\ 0 & \text{otherwise} \end{cases}$$

and $$Q_H = Q_V^T = \begin{pmatrix} 0 & 0 & 0 \\ \frac{1}{2} & 0 & \frac{1}{2} \\ 0 & 0 & 0 \end{pmatrix}$$

After obtaining low exposure monochrome image 732, at 736, a high dynamic range monochrome image 730 can be generated by combining the monochrome images of different exposures and their associated information—e.g., the monochrome image 720 generated using primary filters 712 and the low exposure monochrome image 732 generated using secondary filters 714.

In some embodiments, tri-chromatic (RGB) image 740 can be generated from a single captured image by using information obtained from primary filters 712. As described previously in FIG. 6, the primary filters 712 used in color filter array 710, such as primary filters a, b, and c in FIG. 4, have spectral responses similar to red, green, and blue filters. At 742 and 744, tri-chromatic (RGB) image 740 can be constructed using color reproduction matrix T' and H' (a linear transformation from CIE XYZ tristimulus values to sRGB tristimulus values) to combine the information in the $\hat{x}_a, \hat{x}_b, \hat{x}_c$ images computed using the primary filters. The RGB image can be expressed as:

$$I_{RGB}(i,j) = HT'[\hat{x}_a(i,j)\hat{x}_b(i,j)\hat{x}_c(i,j)]^T$$

As described previously, to calculate the difference of color for color reproduction of a RGB image, the CIE 1931 XYZ color space (created by the International Commission on Illumination), which is based on direct measurements of human visual perception and serves as the basis of which many other color spaces are defined, can be used. The calculation of sRGB tristimulus values (which are employed in some digital cameras or color monitors) from the CIE XYZ tristimulus values is a linear transformation. The CIE XYZ tristimulus values can be defined as $Y=A^T IR$, where Y represents the true tristimulus values and A is a matrix of CIE XYZ color matching functions $[\bar{x}\ \bar{y}\ \bar{z}]$. The estimated CIE tristimulus values corresponding to the primary filters $\hat{Y}'$ can be expressed as an optimal linear transformation: $\hat{Y}'=T'X'$, where $X'=[x_a, x_b, x_c]^T$. The transformation T' is determined so as to minimize the color difference: $\min \|Y-T'X'\|^2$.

In some embodiments, a HDR RGB image 760 can be generated from a single captured image by using information obtained from primary filters 712 and secondary filters 714 of color filter array 710. To create a high dynamic range tri-chromatic image (e.g., image 760), a low exposure tri-chromatic image 750 can be constructed.

Full resolution secondary filter images—$\hat{x}_d, \hat{x}_e, \hat{x}_f$, and $\hat{x}_g$—can be respectively computed using the d, e, f, and g pixels using bilinear interpolation. However, this can result in severe aliasing. In some embodiments, the aliasing of the secondary filter images can be estimated using information from the primary filter images—$\hat{x}_a, \hat{x}_b, \hat{x}_c$ at 752. It should be noted that there is a strong correlation between the spectra of primary filters 712 and secondary filters 714, as shown by the overlap in FIG. 6. For example, when anti-aliasing the full resolution image $\hat{x}_e$ that corresponds to filter e, it should be noted that filter e has a strong correlation with that of filter a.

Accordingly, the interpolated full resolution filter a image $\hat{x}_a$ at each filter e locations can be sampled. These can then be used to calculate a full resolution image for filter e, which can be expressed as:

$$\Omega\{W_e(i,j)\hat{x}_a(i,j)\}$$

where $\Omega(\cdot)$ represents bilinear interpolation. Aliasing can be inferred by subtracting the original $\hat{x}_a$ image from the interpolated one. Then, to obtain the final estimate of aliasing in channel e, the above-mentioned difference can be scaled by $\Psi_{ae}$ which is the ratio of the filter transmittances of the a and e pixels, to take into account the difference in exposures of a and e pixels. The estimated aliasing $\Psi_{ae}$ can be expressed as follows:

$$\gamma_e(i,j)=[\Omega\{W_e(i,j)\hat{x}_a(i,j)\}-\hat{x}_a(i,j)]\Psi_{ae}$$

where:

$$\psi_{ae} = \frac{\left(\sum_{l=1}^{L} C_e\right)}{\left(\sum_{l=1}^{L} C_a\right)}$$

Accordingly, the anti-aliased image $\hat{x}_e$ can be calculated at 754 as:

$$\hat{x}_e(i,j)=\Omega\{W_e(i,j)y(i,j)\}-\gamma_e(i,j)$$

In addition, other anti-aliased secondary can be similar calculated.

Figure 8:
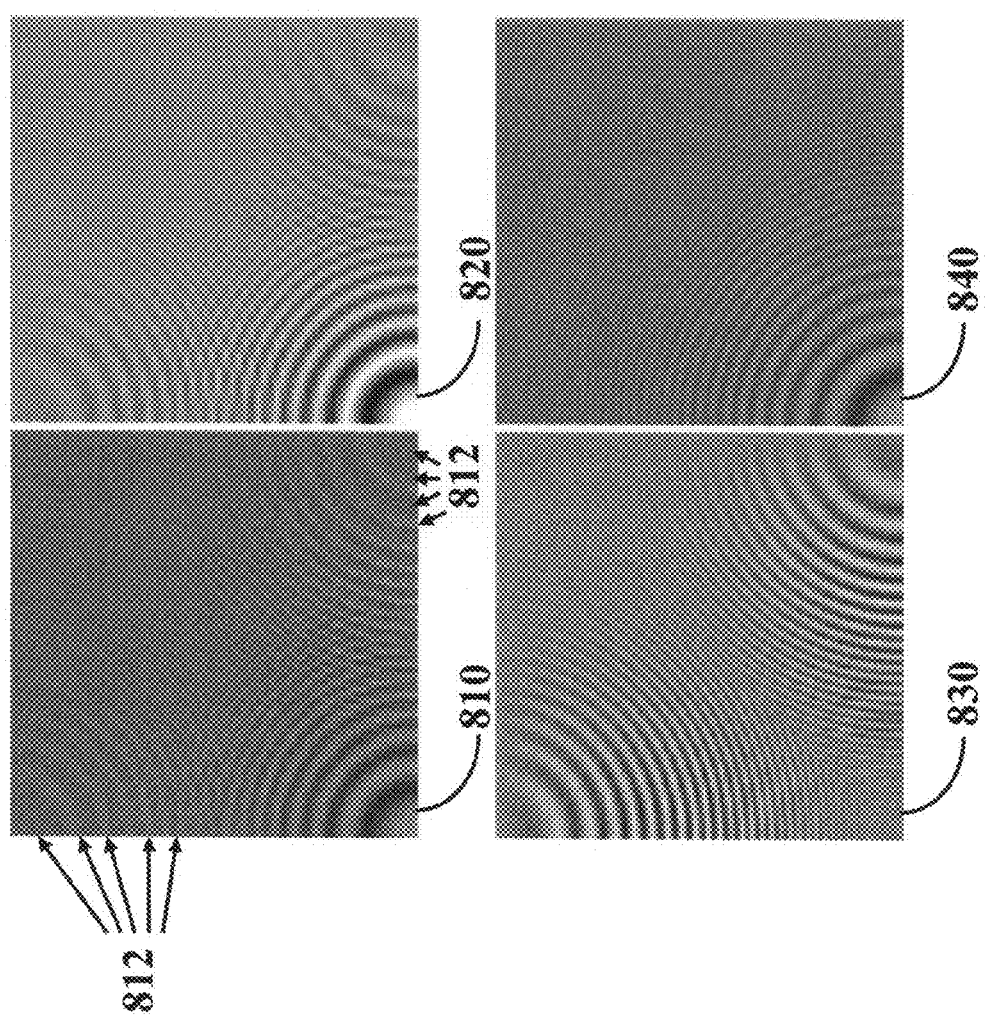
FIG. 8 illustrates examples of low exposure RGB images calculated from the secondary filters through the anti-aliasing approach in accordance with some embodiments of the disclosed subject matter.

FIG. 8 shows examples of low exposure RGB images calculated from the secondary filters through the anti-aliasing approach. For example, image 810 shows a low exposure RGB image calculated from secondary filters 714 without anti-aliasing. It should be noted that false color artifacts 812 caused by aliasing are present. Image 820 shows the downsampled image fit $\Omega\{W_e(i,j)\hat{x}_a(i,j)\}$ calculated using the pixels with primary filter a of primary filters 712. Image 830 then shows the aliasing $Y_e(i,j)$ estimated using the downsampled image 820 and the full resolution image for channel a. It should be noted that the brightness of image 830 is enhanced for visualization. Accordingly, image 840 is a lower exposure RGB image obtained after anti-aliasing using image 830, which provides the estimation of aliasing. Image 840 shows the efficacy of the anti-aliasing approach, where false color artifacts (e.g., artifacts 812 in image 820) can be removed.

A low exposure RGB image can be obtained by multiplying the secondary filter images by a color reproduction matrix at 756, which can be expressed as:

$$I_{LERGB}(i,j)=HT''[\hat{x}_d(i,j)\hat{x}_e(i,j)\hat{x}_f(i,j)\hat{x}_g(i,j)]^T$$

where T'' is the color reproduction matrix and H is the linear transformation from CIE XYZ to sRGB.

After obtaining low exposure RGB 750, at 758, a high dynamic range RGB image 760 can be generated by combining the tri-chromatic (RGB) images of different exposures and their associated information—e.g., the RGB image 740 and the low exposure RGB image 750.

In some embodiments, a multispectral image 770 can be generated from a single captured image using information from primary filters 712 and secondary filters 714 of color filter array 710. For multispectral image 770, the spectral reflectance of an object can be reconstructed using images $\hat{x}_a$, $\hat{x}_b$, $\hat{x}_c$ and anti-aliased images $\hat{x}_d$, $\hat{x}_e$, $\hat{x}_f$ and $\hat{x}_g$ at 772. In some embodiments, a HDR RGB image 760 can be generated from a single captured image by using information obtained from primary filters 712 and secondary filters 714 of color filter array 710.

As described previously, the spectral distribution is reconstructed by minimizing the expression: $\|F\cdot\sigma-X\|^2$. In some embodiments, the reconstruction approach can be expressed as a constrained minimization as follows: $\hat{\sigma}=\arg\min \|\tilde{F}\cdot\sigma-\tilde{X}\|^2$, subject to $B\cdot\sigma\geq 0$, where $\tilde{F}=[F^T \alpha P^T]^T$, $P_{lk}=\partial^2 b_k(\lambda_1)/\partial\lambda^2$ is a smoothness constraint, $\alpha$ is a smoothness parameter, $1>L$, $1\geq k\geq K$, $\tilde{x}=[x^T 0]^T$, and $B=[b_k(\lambda_1)]$. This regularized minimization can be solved using quadratic programming.

Figure 9:
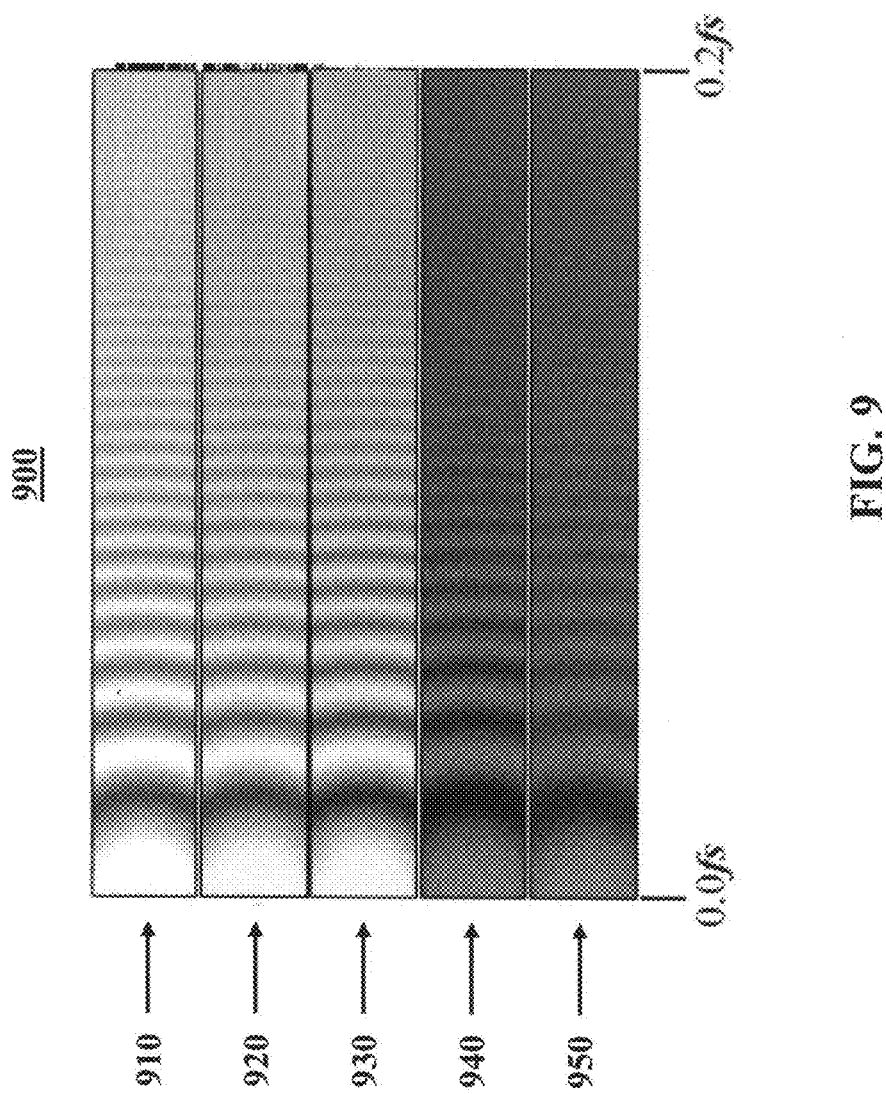
FIG. 9 illustrates an original image of a Circular Zone Plate (CZP) and multiple images generated from a single captured image of the original image in accordance with some embodiments of the disclosed subject matter.

FIG. 9 shows an original image 910 of a Circular Zone Plate (CZP) and multiple images 920, 930, 940, and 950 generated from a single captured image of the original image 910 in accordance with some embodiments. It should be noted that original image 910, which serves as the ground truth, shows a CZP image calculated using a diffraction-limited model of a lens with a f-number of 5.6 and a 1.0 μm pixel size. Using a camera system with a generalized assorted pixel color filter array or mosaic (e.g., color filter array 400, color filter array 710, etc.) having multiple primary filters and multiple secondary filters to capture an image, multiple image types—e.g., a demosaiced monochrome image 920, a demosaiced tri-chromatic (RGB) image 930, a demosaiced and anti-aliased low exposure monochrome image 940, and a demosaiced and anti-aliased low exposure tri-chromatic (RGB) image 950—can be generated.

Figure 10:
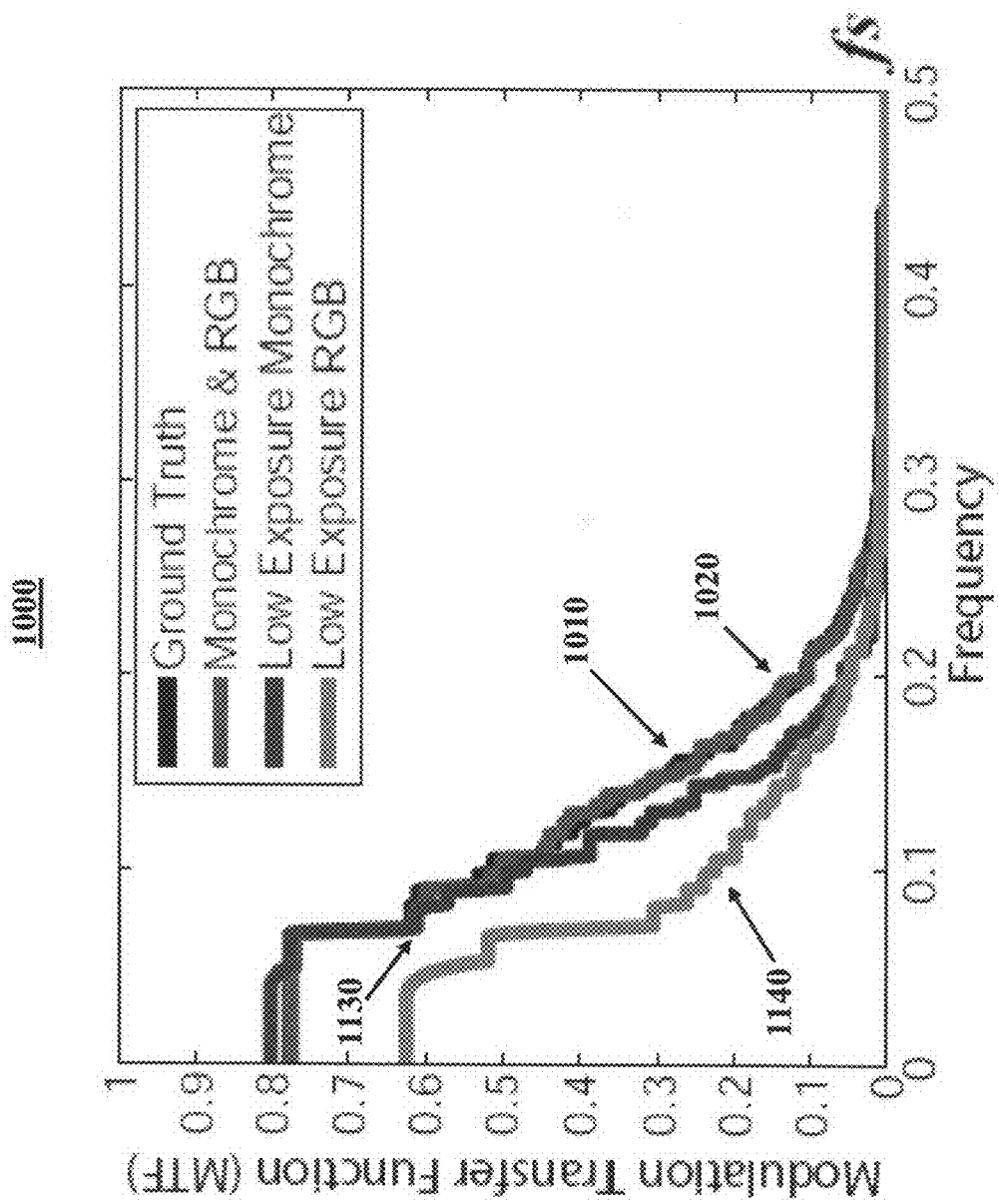
FIG. 10 illustrates the Modulation Transfer Function (MTF) calculated for the generated images shown in FIG. 9 in accordance with some embodiments of the disclosed subject matter.

FIG. 10 shows Modulation Transfer Function (MTF) calculations for each image 910, 920, 930, 940, and 950. As shown, curve 1010 is associated with original image 910, curve 1020 is associated with monochrome image 920 and tri-chromatic (RGB) image 930, curve 1030 is associated with low exposure monochrome image 940, and curve 1040 is associated with low exposure tri-chromatic (RGB) image 950. Note that curve 1010 for monochrome image 920 and tri-chromatic (RGB) image 930, which were generated using primary filters of the color filter array, is substantially similar to curve 1020 associated with original image 910. Note also that the low exposure monochrome image 940 has a MTF of about 0.1 at 0.1754 fs, while the low exposure tri-chromatic (RGB) image 950 has a MTF of about 0.1 at 0.1647 fs. For standard monochrome and RGB, this generally occurs at 0.2125 fs. This demonstrates that the camera mechanisms that use a color filter array with multiple primary filters and multiple secondary filters and a multimodal demosaicing approach allows a user to control the trade-off between spatial resolution and radiometric details of the recovered image.

Figure 11:
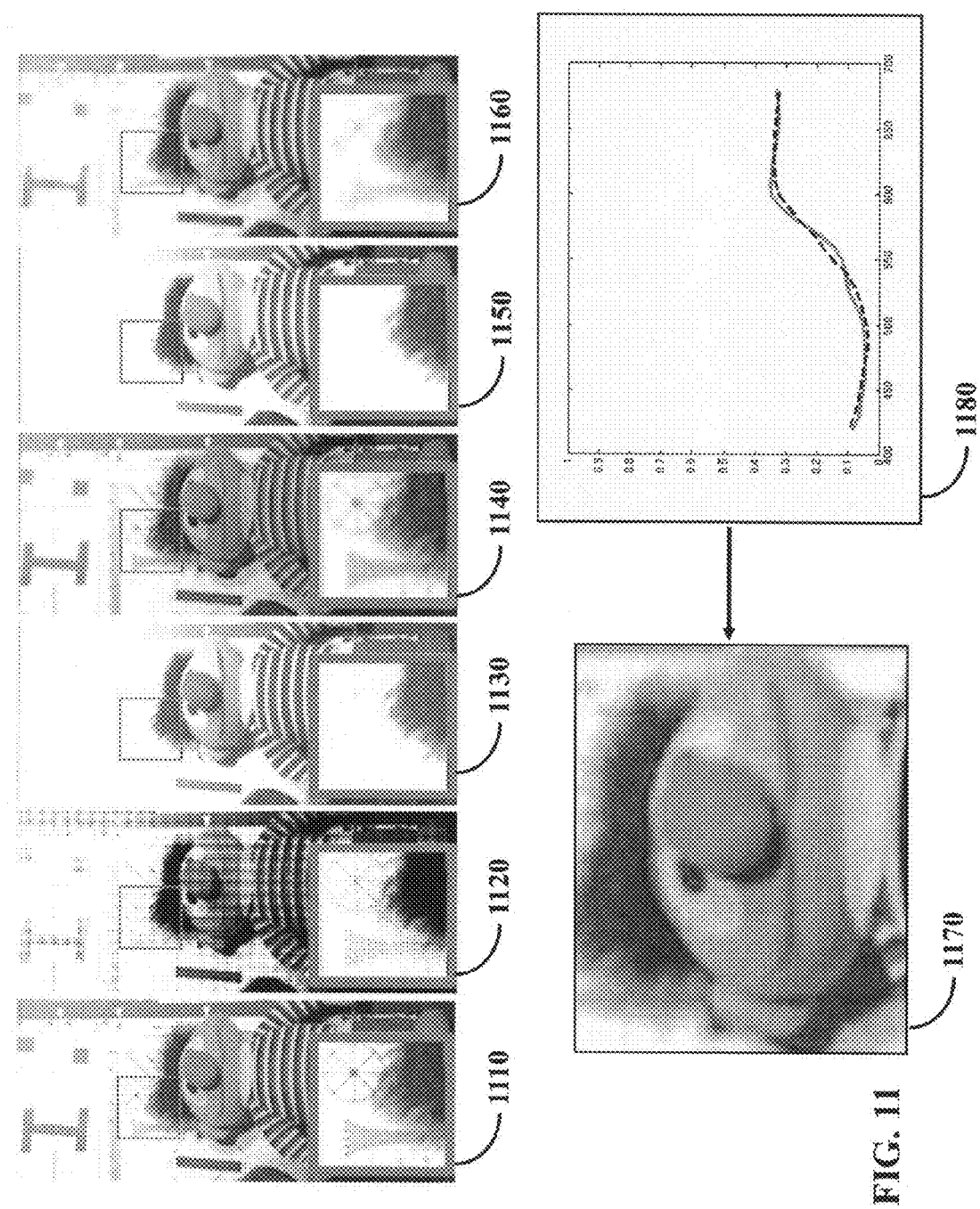
FIGS. 11 and 12 illustrate additional examples of images generated from a single captured image in accordance with some embodiments of the disclosed subject matter.
Figure 12:
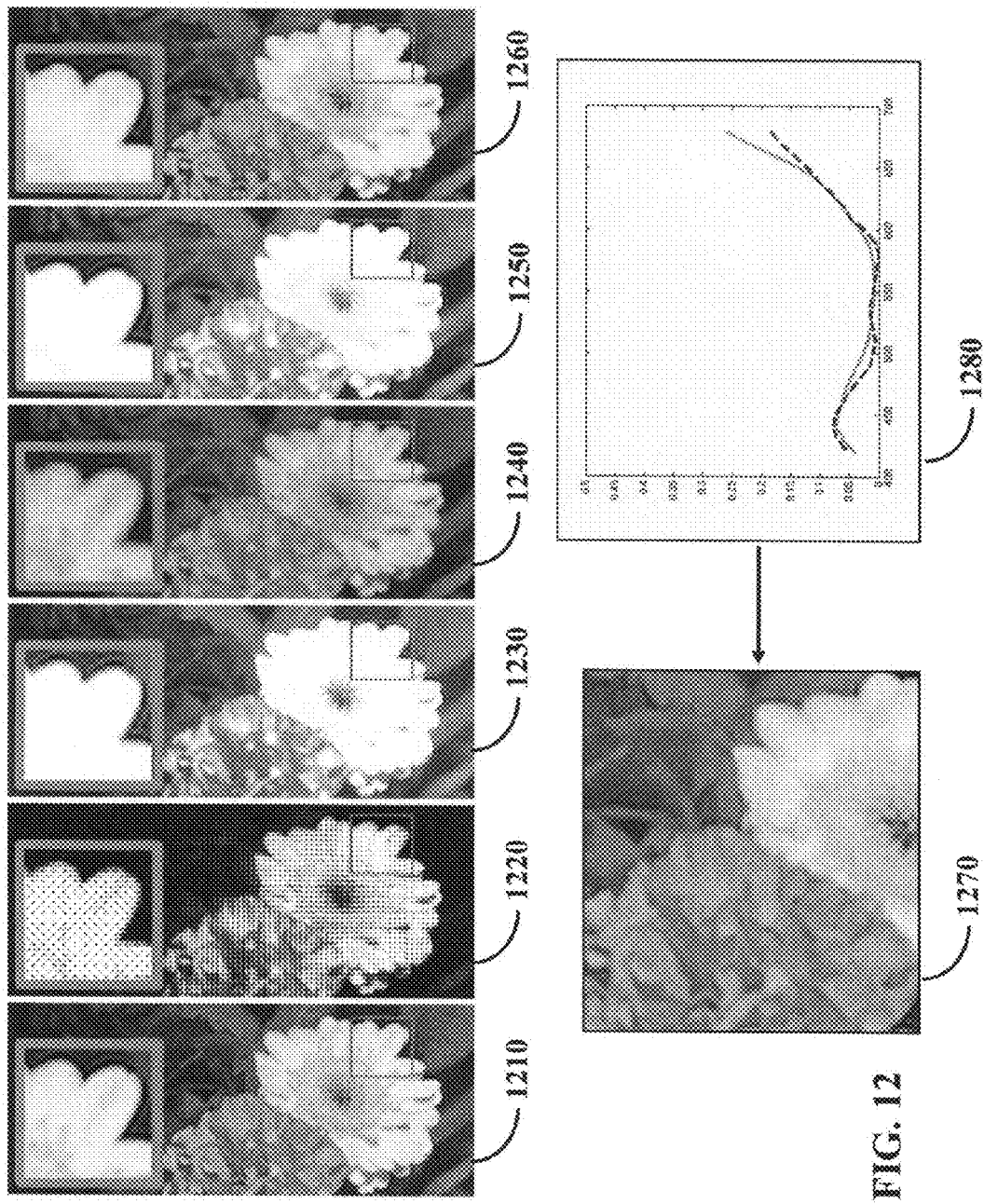

Additional examples of images generated from a single captured image are shown in FIGS. 11 and 12. Note that ground truth images 1110 of FIG. 11 and 1210 of FIG. 12 are calculated using a diffraction-limited model of a lens with a f-number of 5.6 and a 1.0 μm pixel size. Image 1120 of FIG. 11 and image 1220 of FIG. 12 show examples of raw images captured using a camera system having a generalized assorted pixel color filter array or mosaic with primary filters and secondary filters. Image 1130 of FIG. 11 and image 1230 of FIG. 12 show examples of demosaiced monochrome images generated using raw image 1120 and 1220, respectively, and the information obtained from the primary filters. Image 1140 of FIG. 11 and image 1240 of FIG. 12 show examples of high dynamic range monochrome images generated using raw image 1120 and 1220, respectively, and the information obtained from the primary and secondary filters. Image 1150 of FIG. 11 and image 1250 of FIG. 12 show examples of tri-chromatic (RGB) images generated using raw image 1120 and 1220, respectively, and the information obtained from the primary filters. Image 1160 of FIG. 11 and image 1260 of FIG. 12 show examples of high dynamic range tri-chromatic (RGB) images generated using raw image 1120 and 1220, respectively, and the information obtained from the primary and secondary filters.

It should be noted that the texture and color of saturated regions in the monochrome and RGB images become visible in the corresponding high dynamic range images. As also shown in FIGS. 11 and 12, more detail is shown in the high dynamic range monochrome image than in the high dynamic range tri-chromatic (RGB) image.

In addition, FIGS. 11 and 12 show examples of multispectral images generated using information obtained and calculated from primary and secondary filters. For example, image 1170 of FIG. 11 and image 1270 of FIG. 12 shows 31-band multispectral images (400-700 nm, at 10 nm intervals) of several static scenes capturing by using a tunable filter and a cooled CCD camera. The corresponding reconstructed spectral reflectance curves 1180 and 1280 show that the reconstructed spectral reflectance (identified by the dashed line) is substantially similar to the spectral reflectance of the ground truth image.

Alternatively, some camera systems can use a different generalized assorted pixel color filter array to capture a single image of a scene and control the trade-off between image resolution, dynamic range, and spectral detail to generate images of multiple image types.

For example, FIG. 13 shows an example of an 8×8 color filter array 1300 that includes five different color filters—e.g., Green (G), Red (R), Blue (B), Yellow (Y), and Emerald (E). Each color filter has two exposures—e.g., a bright exposure and a dark exposure, where color (C) denotes a bright pixel and color (C) denotes a dark pixel. For example, pixel G denotes a bright green pixel, while pixel G' denotes a dark green pixel.

As shown in FIG. 13, the bright and dark green channel samples every two lines in the horizontal and vertical directions and sample at every line in the diagonal direction. Accordingly, the horizontal and vertical sampling frequency of bright and dark green channel is $f_{HV}/2$ and the diagonal sampling frequency of bright and dark green channel is $f_D$, where $f_{HV}$ is the horizontal and vertical sampling frequency and $f_D$ is the diagonal sampling frequency of the image sensor. In addition, the horizontal and vertical Nyquist frequency of bright and dark green channel is half of the sampling frequency or $f_{HV}/4$, while the diagonal Nyquist frequency of bright and dark green channel is $f_D/2$. Referring back to FIG. 13, bright and dark red, blue, yellow, and emerald channels sample every four lines in the horizontal and vertical directions and sample every two lines in the diagonal direction. Accordingly, the horizontal and vertical sampling frequency of bright and dark red, blue, yellow, and emerald channels is $f_{HV}/4$ and the corresponding diagonal sampling frequency is $f_D/2$. Thus, the horizontal and vertical Nyquist frequency of bright and dark red, blue, yellow, and emerald channels is $f_{HV}/8$ and the corresponding diagonal Nyquist frequency is $f_D/4$.

Figure 14:
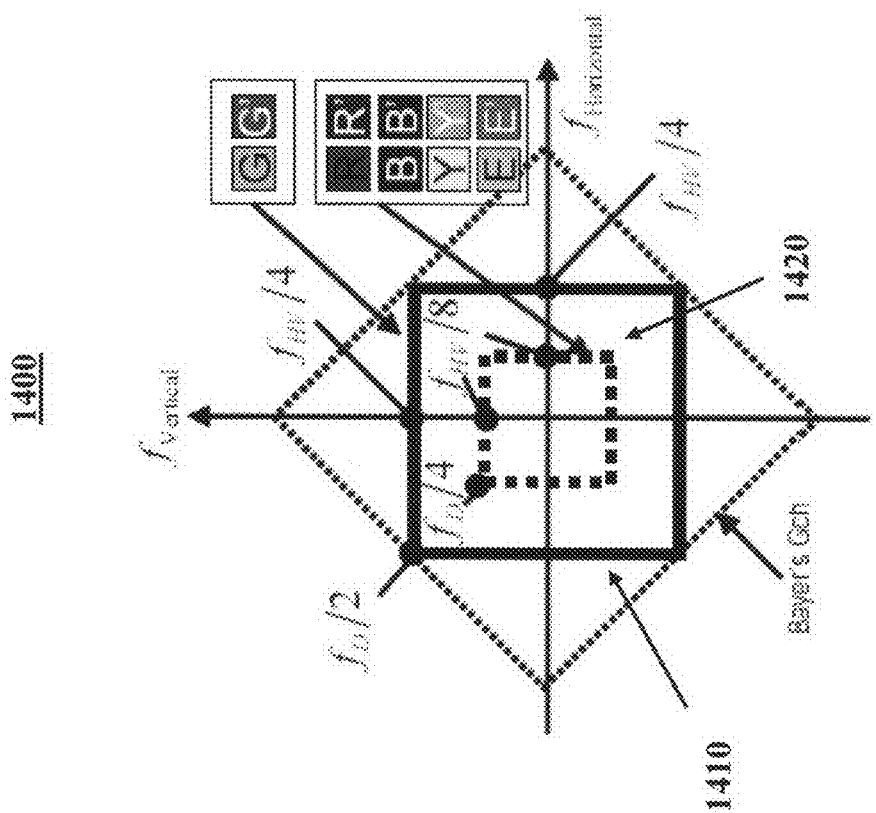
FIG. 14 illustrates the Nyquist or usable frequency region of the color filter array shown in FIG. 13 in accordance with some embodiments of the disclosed subject matter.

To further illustrate the Nyquist frequencies of color filter array 1300 of FIG. 13, the Nyquist or usable frequency region 1400 in the frequency domain is shown in FIG. 14. As shown, the Nyquist region of the bright and dark green channel is located in the substantially square area identified by a full line 1410 and the Nyquist region of the bright and dark red, blue, yellow, and emerald channels is located in the substantially square area identified by a dashed line 1420.

In another example of a color filter array in accordance with some embodiments of the disclosed subject matter, FIG. 15 shows an example of a 9×9 color filter array 1500 that includes five different color filters—e.g., Green (G), Red (R), Blue (B), Yellow (Y), and Emerald (E).

As shown in FIG. 15, the green channel samples every line in the horizontal and vertical directions and samples at every line in the diagonal direction. Accordingly, the horizontal and vertical sampling frequency of dark green channels is $f_{HV}$ and the diagonal sampling frequency of green channels is $f_D$. In addition, the horizontal and vertical Nyquist frequency of green channels is half of the sampling frequency or $f_{HV}/2$, while the diagonal Nyquist frequency of green channels is $f_D/2$. Referring back to FIG. 15, red, blue, yellow, and emerald channels sample every two lines in the horizontal and vertical directions and sample every two lines in the diagonal direction. Accordingly, the horizontal and vertical sampling frequency of red, blue, yellow, and emerald channels is $f_{HV}/2$ and the corresponding diagonal sampling frequency is $f_D/2$. Thus, the horizontal and vertical Nyquist frequency of red, blue, yellow, and emerald channels is $f_{HV}/4$ and the corresponding diagonal Nyquist frequency is $f_D/4$.

Figure 16:
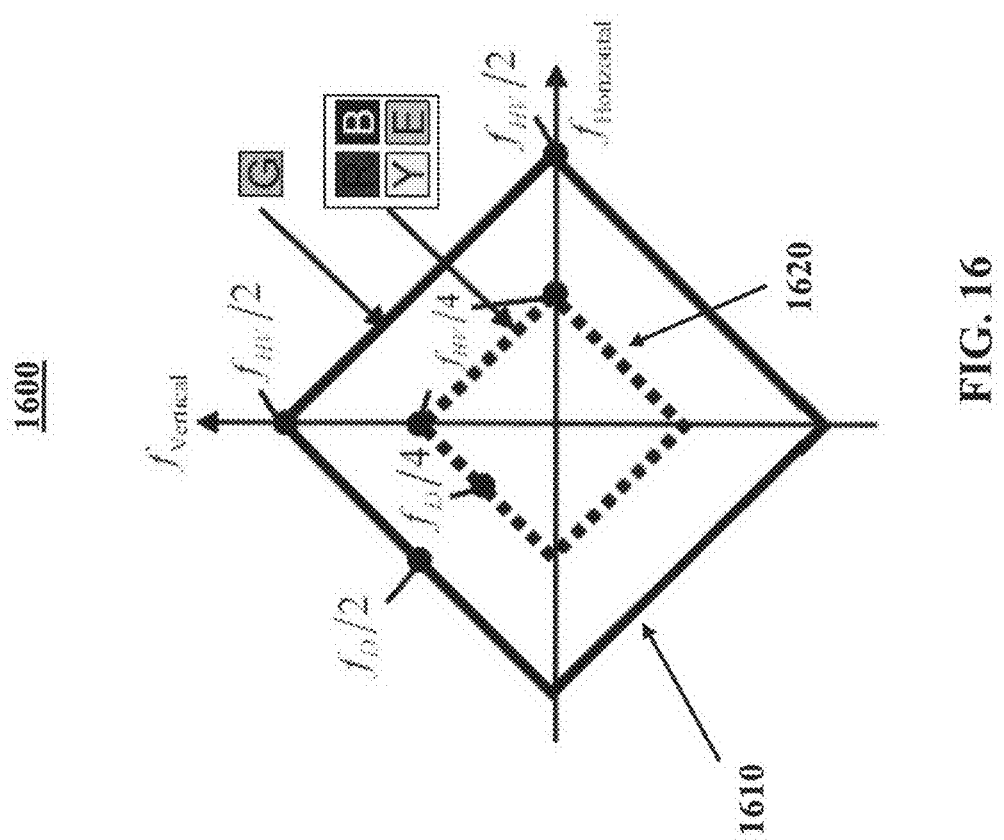
FIG. 16 illustrates the Nyquist or usable frequency region of the color filter array shown in FIG. 15 in accordance with some embodiments of the disclosed subject matter.

The Nyquist frequencies of color filter array 1500 are further illustrated in FIG. 16. As shown, FIG. 16 shows that the Nyquist region of the green channel is located in the substantially diamond area identified by a full line 1610 and the Nyquist region of the red, blue, yellow, and emerald channels is located in the substantially diamond area identified by a dashed line 1620.

Similarly, as described above, multiple image types can be generated from a single captured image using a camera system with a color filter array, such as color filter array 1300 of FIG. 13 or color filter array 1500 of FIG. 15, in accordance with some embodiments of the disclosed subject matter. For example, the information obtained from the five color filters with two exposures of color filter array 1300 of FIG. 13 can be used to generate a monochrome image, a high dynamic range (HDR) monochrome image, a tri-chromatic (RGB) image, a HDR RGB image, and a multispectral image. In another example, the information obtained from the five color filters of color filter array 1500 of FIG. 15 can be used to generate multiple types of images, such as a monochrome image and a tri-chromatic (RGB) image. As also described above, a demosaicing approach with anti-aliasing can be applied to generate images of multiple types.

In some embodiments, using one of color filter arrays 1300 or 1500, a linear regression model of local color distribution can be used to reduce aliasing effects. For example, it has been determined that there are strong inter-color correlations at small local areas (e.g., on a color-changing edge). These local color distributions in an image can be expressed by the following linear regression model:

$$\hat{R}_{ij} = \frac{V_{GR}}{V_{GG}}(G_{i,j} - M_G) + M_R$$

where:

$$M_C = \exp[C_{i,j}|i,j \in \Omega]$$

$$V_{C_1C_2} = \exp[(C_{1i,j} - M_{C_1})(C_{2i,j} - M_{C_2})|i,j \in \Omega]$$

It should be noted that a pixel at location (i,j) in color filters arrays 1300 or 1500 can be represented by either ($R_{i,j}$, $g_{i,j}$, $b_{i,j}$, $y_{i,j}$, $e_{i,j}$), ($r_{i,j}$, $G_{i,j}$, $b_{i,j}$, $y_{i,j}$, $e_{i,j}$), ($r_{i,j}$, $g_{i,j}$, $B_{i,j}$, $y_{i,j}$, $e_{i,j}$), ($r_{i,j}$, $g_{i,j}$, $b_{i,j}$, $Y_{i,j}$, $e_{i,j}$), or ($r_{i,j}$, $g_{i,j}$, $b_{i,j}$, $y_{i,j}$, $E_{i,j}$), where $R_{i,j}$, $G_{i,j}$, $B_{i,j}$, $Y_{i,j}$ and $E_{i,j}$ denote the known red, green, blue, yellow, and emerald components of the color filter array and $r_{i,j}$, $g_{i,j}$, $b_{i,j}$, $y_{i,j}$, $e_{i,j}$ denote the unknown components of the color filter array. In addition, it should also be noted that the estimates of $r_{i,j}$, $g_{i,j}$, $b_{i,j}$, $y_{i,j}$, $e_{i,j}$ are denoted as $\hat{R}_{i,j}$, $\hat{G}_{i,j}$, $\hat{B}_{i,j}$, $\hat{Y}_{i,j}$, and $\hat{E}_{i,j}$.

The resulting Fourier transforms of $V_{GR}$ and $M_R$ are as follows:

$$M_R \xRightarrow{\mathcal{F}} R_\omega(0)$$

$$V_{GR} \xRightarrow{\mathcal{F}} \int_{-\infty}^{\infty} G_\omega(\omega) R_\omega(\omega) d\omega$$

Using these expressions, the aliasing of R can be estimated.

Figure 17:
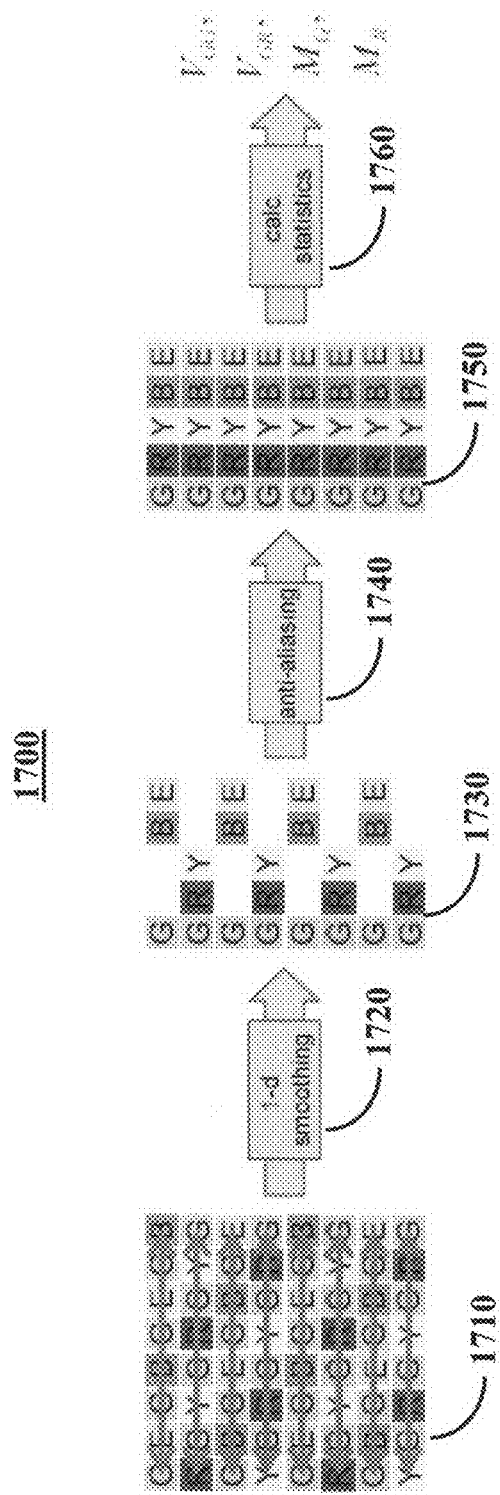
FIG. 17 illustrates a directional smoothing approach that can be used to reduce aliasing effects for images generated using the color filter arrays shown in FIGS. 13 and 15 in accordance with some embodiments of the disclosed subject matter.

In some embodiments, using one of color filter arrays 1300 or 1500, directional smoothing can be used to reduce aliasing effects. For example, to reduce the computational cost of anti-aliasing, directional smoothing can be used when the local statistics (e.g., $V_{GG}$, $V_{GR}$, $M_G$, and $M_R$) are calculated. As shown in FIG. 17, one-dimensional smoothing along a direction to the local area of the color filter array 1710 is applied at 1720 to obtain one-dimensional signals of colors 1730. Then, an anti-aliasing approach is applied to the one-dimensional color signals 1730 at 1740. After anti-aliasing, color data for each phase is obtained at 1750. Local statistics (e.g., $V_{GG}$, $V_{GR}$, $M_G$, and $M_R$) can then be calculated at 1760 using the anti-aliased one-dimensional color data.

It should be noted that the directional smoothing approach can be applied in any suitable direction. For example, the smoothing approach can be applied in the horizontal, vertical, right-ascending diagonal (↗), and right-descending diagonal direction (↘). It should also be noted that the direction of smoothing can be selected based at least in part on the direction of the local texture (e.g., horizontal smoothing for horizontal stripes).

In some embodiments, the directional smoothing approach for several directions (e.g., horizontal, vertical, right-ascending diagonal, and right-descending diagonal direction) is performed and anti-aliasing, computing local statistics, and output color interpolations are also performed for each direction. By measuring magnitudes of the gradient and local color variance of the anti-aliased one-dimensional signals, residual aliasing for each direction can be evaluated. In some embodiments, the direction that provides the smallest residual aliasing can be selected as the suitable direction of the interpolation filter.

Figure 18:
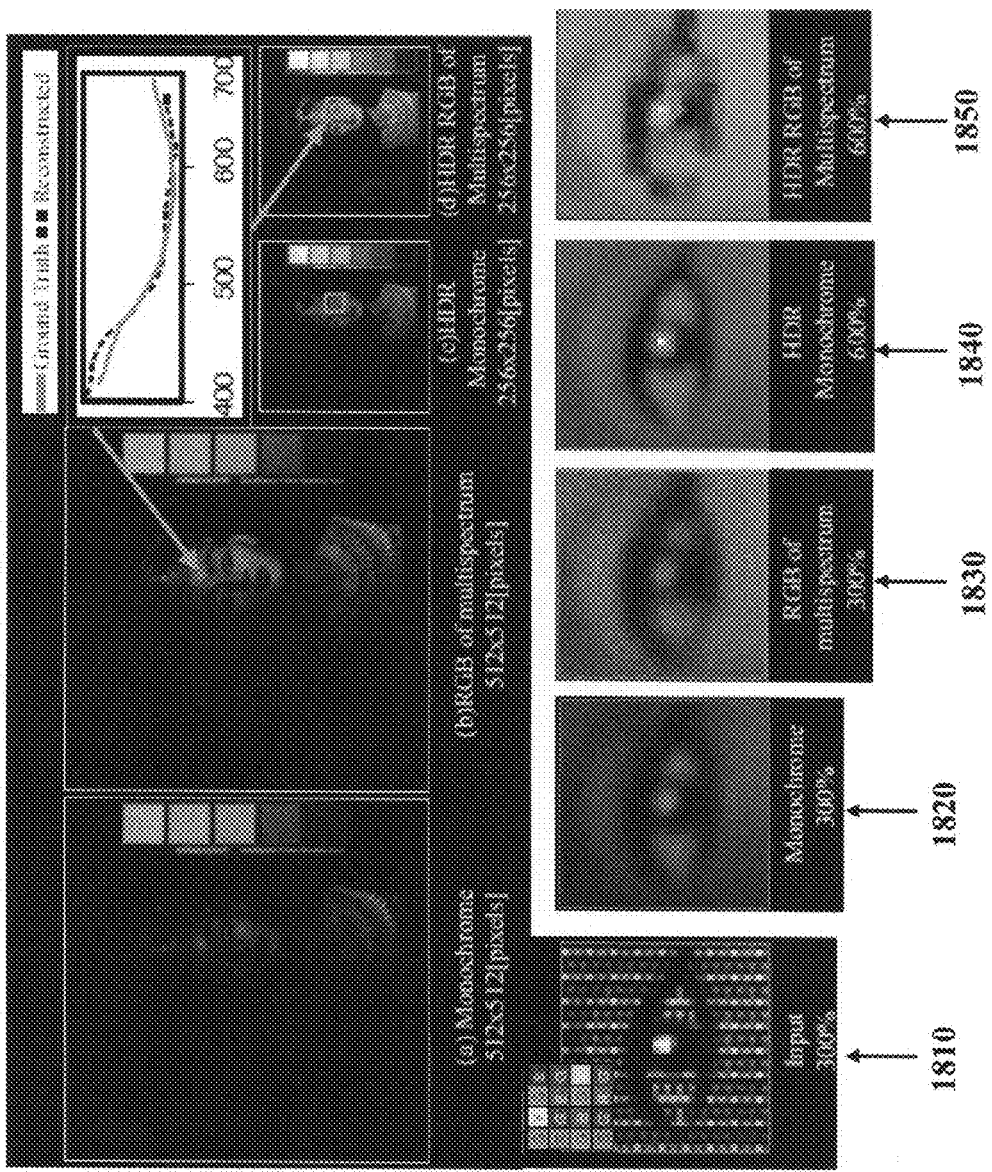
FIG. 18 illustrate additional examples of images generated from a single captured image using a camera system having one of the color filter arrays shown in FIGS. 13 and 15 in accordance with some embodiments of the disclosed subject matter.

FIG. 18 shows a portion of an original image 1810 and multiple images 1820, 1830, 1840, and 1850 generated from a single captured image of the original image 1810 in accordance with some embodiments. Using a camera system with a generalized assorted pixel color filter array or mosaic, such as color filter array 1300 of FIG. 13, having five different color filters, each having two exposures (e.g., a bright exposure and a dark exposure) to capture an image and the anti-aliasing approach described above, multiple image types—e.g., a monochrome image 1820, a tri-chromatic (RGB) image 1830, a high dynamic range (HDR) monochrome image 1840, and a HDR RGB image 1850—can be generated. It should be noted that, by sacrificing spatial resolution, the quality of the spectrum and the dynamic range can be improved.

In some embodiments, hardware used in connection with the camera mechanisms can include an image processor, an image capture device (that includes a generalized assorted pixel color filter array, such as the one in FIG. 4), and image storage. The image processor can be any suitable device that can process images and image-related data as described herein. For example, the image processor can be a general purpose device such as a computer or a special purpose device, such as a client, a server, an image capture device (such as a camera, video recorder, scanner, mobile telephone, personal data assistant, etc.), etc. It should be noted that any of these general or special purpose devices can include any suitable components such as a processor (which can be a microprocessor, digital signal processor, a controller, etc.), memory, communication interfaces, display controllers, input devices, etc. The image capture device can be any suitable device for capturing images and/or video, such as a portable camera, a video camera or recorder, a computer camera, a scanner, a mobile telephone, a personal data assistant, a closed-circuit television camera, a security camera, an Internet Protocol camera, etc. The image capture device can include the generalized assorted pixel color filter array as described herein. The image storage can be any suitable device for storing images such as memory (e.g., non-volatile memory), an interface to an external device (such as a thumb drive, a memory stick, a network server, or other storage or target device), a disk drive, a network drive, a database, a server, etc.

Accordingly, generalized assorted pixel camera systems and methods are provided.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed is:

1. A color filter array, the array comprising:
    a plurality of primary filters and a plurality of secondary filters, wherein each of the plurality of primary filters and each of the plurality of secondary filters has a particular spectral response and wherein each of the plurality of primary filters and each of the plurality of secondary filters is formed on a corresponding pixel of a plurality of pixels;
    wherein each of the plurality of primary filters and each of the plurality of secondary filters enhances an attribute of image quality and wherein the information obtained using the plurality of primary filters and the plurality of secondary filters during a single exposure of the plurality of pixels is used to balance spatial resolution and the image quality for generating at least two images that are each of a different image type of a plurality of image types;
    wherein a first subset of filters includes primary filters of the plurality of primary filters having a first spectral response, a second subset of filters includes primary filters of the plurality of primary filters having a second spectral response, and a third subset of filters includes primary filters of the plurality of primary filters having a third spectral response, where each of the first subset, second subset, and third subset are arranged such that each primary filter of that subset is separated by about twice the length of the pixel corresponding to that primary filter measured from the center of the pixel to another primary filter of that subset in both the horizontal and vertical directions,
    a fourth subset of filters includes secondary filters of the plurality of secondary filters having a fourth spectral response, a fifth subset of filters includes secondary filters of the plurality of secondary filters having a fifth spectral response a sixth subset of filters includes secondary filters of the plurality of secondary filters having a sixth spectral response, and a seventh subset of filters includes secondary filters of the plurality of secondary filters having a seventh spectral response, where each of the fourth subset, fifth subset, sixth subset and seventh subset are arranged such that each secondary filter of that subset is separated by about four times the length of the pixel corresponding to that secondary filter measured from the center of the pixel to another secondary filter of that subset in both the horizontal and vertical directions, and wherein each of the first through third subsets of filters have a different spectral response, the fourth spectral response is highly correlated with the first spectral response and has a lower transmittance than the first spectral response, the fifth and sixth spectral responses are each highly correlated with different portions of the second spectral response and each have lower transmittance than the second spectral response, and the seventh spectral response is highly correlated with the third spectral response and has a lower transmittance than the third spectral response.

2. The color filter array of claim 1, wherein the corresponding pixel of the plurality of pixels is a submicron pixel.

3. The color filter array of claim 1, wherein the information obtained from pixels corresponding to the plurality of primary filters and the plurality of secondary filters is used to balance spectral resolution, dynamic range, and spatial resolution for generating the at least two images that are each of a different image type of the plurality of image types.

4. The color filter array of claim 1, wherein the attribute of image quality includes at least one of: color reproduction, spectral resolution, dynamic range, and sensitivity.

5. The color filter array of claim 1, wherein the plurality of image types includes at least two of: a monochrome image, a high dynamic resolution monochrome image, a tri-chromatic image, a high dynamic resolution tri-chromatic image, and a multispectral image.

6. The color filter array of claim 1, wherein each of the plurality of primary filters has a greater transmittance than each of the plurality of secondary filters.

7. The color filter array of claim 1, wherein the color filter array includes a first color filter having the first spectral response, a second color filter having the second spectral response, a third color filter having the third spectral response, a fourth color filter having the fourth spectral response, a fifth color filter having the fifth spectral response, a sixth color filter having the sixth spectral response, and a seventh color filter having the seventh spectral response, and wherein the plurality of primary filters includes the first color filter, the second color filter, and the third color filter and the plurality of secondary filters includes the fourth color filter, the fifth color filter, the sixth color filter, and the seventh color filter.

8. A method for generating images, the method comprising:
providing a color filter array, the color filter array comprising:
a plurality of primary filters and a plurality of secondary filters, wherein each of the plurality of primary filters and each of the plurality of secondary filters has a particular spectral response and wherein each of the plurality of primary filters and each of the plurality of secondary filters is formed on a corresponding pixel of a plurality of pixels;

wherein each of the plurality of primary filters and each of the plurality of secondary filters enhances an attribute of image quality and wherein the information obtained using the plurality of primary filters and the plurality of secondary filters during a single exposure of the plurality of pixels is used to balance spatial resolution and the image quality for generating at least two images that are each of a different image type of a plurality of image types;

wherein a first subset of filters includes primary filters of the plurality of primary filters having a first spectral response, a second subset of filters includes primary filters of the plurality of primary filters having a second spectral response, and a third subset of filters includes primary filters of the plurality of primary filters having a third spectral response, where each of the first subset, second subset, and third subset are arranged such that each primary filter of that subset is separated by about twice the length of the pixel corresponding to that primary filter measured from the center of the pixel to another primary filter of that subset in both the horizontal and vertical directions, a fourth subset of filters includes secondary filters of the plurality of secondary filters having a fourth spectral response, a fifth subset of filters includes secondary filters of the plurality of secondary filters having a fifth spectral response, a sixth subset of filters includes secondary filters of the plurality of secondary filters having a sixth spectral response, and a seventh subset of filters includes secondary filters of the plurality of secondary filters having a seventh spectral response, where each of the fourth subset, fifth subset, sixth subset and seventh subset are arranged such that each secondary filter of that subset is separated by about four times the length of the pixel corresponding to that secondary filter measured from the center of the pixel to another secondary filter of that subset in both the horizontal and vertical directions, and wherein each of the first through third subsets of filters have a different spectral response, the fourth spectral response is highly correlated with the first spectral response and has a lower transmittance than the first spectral response, the fifth and sixth spectral responses are each highly correlated with different portions of the second spectral response and each have lower transmittance than the second spectral response, and the seventh spectral response is highly correlated with the third spectral response and has a lower transmittance than the third spectral response;

capturing image data using the color filter array, wherein information from pixels corresponding to both the plurality of primary filters and the plurality of secondary filters is included in the image data; and generating the at least two images from the captured image data that are each of a different image type of the plurality of image types, wherein one of the at least two images is based primarily on the information from pixels corresponding to the plurality of primary filters, and another of the at least two images is based on both the information from pixels corresponding to the plurality of primary filters and the information from pixels corresponding to the plurality of secondary filters from the captured image data.

9. The method of claim 8, wherein the corresponding pixel of the plurality of pixels is a submicron pixel.

10. The method of claim 8, wherein the information obtained from pixels corresponding to the plurality of primary filters and the plurality of secondary filters allows a user to balance spectral resolution, dynamic range, and spatial resolution for generating the at least two images that are each of a different image type of the plurality of image types.

11. The method of claim 8, wherein the attribute of image quality includes at least one of: color reproduction, spectral resolution, dynamic range, and sensitivity.

12. The method of claim 8, wherein the plurality of image types includes at least two of: a monochrome image, a high dynamic resolution monochrome image, a tri-chromatic image, a high dynamic resolution tri-chromatic image, and a multispectral image.

13. The method of claim 8, wherein each of the plurality of primary filters has a greater transmittance than each of the plurality of secondary filters.

14. The method of claim 8, wherein the color filter array includes a first color filter having the first spectral response, a second color filter having the second spectral response, a third color filter having the third spectral response, a fourth color filter having the fourth spectral response, a fifth color filter having the fifth spectral response, a sixth color filter having the sixth spectral response, and a seventh color filter having the seventh spectral response, and wherein the plurality of primary filters includes the first color filter, the second color filter, and the third color filter and the plurality of secondary filters includes the fourth color filter, the fifth color filter, the sixth color filter, and the seventh color filter.

15. The method of claim 8, further comprising enhancing the information obtained using the primary filters and secondary filters based on the particular spectral response of each filter in the color filter array by calculating error.

16. The method of claim 15, wherein the error accounts for at least one of: color reproduction error, reflectance reconstruction error, signal-to-noise ratio, and dynamic range.

17. The method of claim 8, further comprising generating a monochrome image using primarily the information from pixels corresponding to the plurality of primary filters.

18. The method of claim 17, further comprising generating a high dynamic range image by generating a low exposure monochrome image using primarily the information from pixels corresponding to the plurality of secondary filters and combining the low exposure monochrome image with the monochrome image.

19. The method of claim 8, further comprising generating a tri-chromatic image using primarily the information from pixels corresponding to the plurality of primary filters.

20. The method of claim 19, wherein the tri-chromatic image is generated using a color reproduction matrix and a linear transformation to combine the information from pixels corresponding to the plurality of primary filters.

21. The method of claim 20, further comprising generating a high dynamic range tri-chromatic image by generating a low exposure tri-chromatic image using primarily the information from pixels corresponding to the plurality of secondary filters and combining the low exposure tri-chromatic image with the tri-chromatic image.

22. The method of claim 21, wherein the low exposure tri-chromatic image is generated by estimating aliasing of the information from pixels corresponding to the plurality of secondary filters using the information from pixels corresponding to the plurality of primary filters.

23. The method of claim 8, further comprising generating a multispectral image, wherein the information from pixels corresponding to the secondary filters is anti-aliased and wherein the anti-aliased information from pixels corresponding to the secondary filters and the information from pixels corresponding to the plurality of primary filters is used to reconstruct spectral reflectance for the multispectral image.

24. A camera system, the system comprising:
a color filter array, the color filter array comprising:
a plurality of primary filters and a plurality of secondary filters, wherein each of the plurality of primary filters and each of the plurality of secondary filters has a particular spectral response and wherein each of the plurality of primary filters and each of the plurality of secondary filters is formed on a corresponding pixel of a plurality of pixels;
wherein each of the plurality of primary filters and each of the plurality of secondary filters enhances an attribute of image quality and wherein the information obtained using the plurality of primary filters and the plurality of secondary filters during a single exposure of the plurality of pixels is used to balance spatial resolution and the image quality for generating at least two images that are each of a different image type of a plurality of image types;
wherein a first subset of filters includes primary filters of the plurality of primary filters having a first spectral response, a second subset of filters includes primary filters of the plurality of primary filters having a second spectral response, and a third subset of filters includes primary filters of the plurality of primary filters having a third spectral response, where each of the first subset, second subset, and third subset are arranged such that each primary filter of that subset is separated by about twice the length of the pixel corresponding to that primary filter measured from the center of the pixel to another primary filter of that subset in both the horizontal and vertical directions,
a fourth subset of filters includes secondary filters of the plurality of secondary filters having a fourth spectral response, a fifth subset of filters includes secondary filters of the plurality of secondary filters having a fifth spectral response, a sixth subset of filters includes secondary filters of the plurality of secondary filters having a sixth spectral response, and a seventh subset of filters includes secondary filters of the plurality of secondary filters having a seventh spectral response, where each of the fourth subset, fifth subset, sixth subset and seventh subset are arranged such that each secondary filter of that subset is separated by about four times the length of the pixel corresponding to that secondary filter measured from the center of the pixel to another secondary filter of that subset in both the horizontal and vertical directions, and
wherein each of the first through third subsets of filters have a different spectral response, the fifth spectral response is highly correlated with the first spectral response and has a lower transmittance than the first spectral response, the fifth and sixth spectral responses are each highly correlated with different portions of the second spectral response and each have lower transmittance than the second spectral response, and the seventh spectral response is highly correlated with the third spectral response and has a lower transmittance than the third spectral response.

25. The camera system of claim 24, wherein the corresponding pixel of the plurality of pixels is a submicron pixel.

26. The camera system of claim 24, wherein the information obtained from pixels corresponding to the plurality of primary filters and the plurality of secondary filters is used to balance spectral resolution, dynamic range, and spatial resolution for generating the at least two images that are each of a different image type of the plurality of image types.

27. The camera system of claim 24, wherein the attribute of image quality includes at least one of: color reproduction, spectral resolution, dynamic range, and sensitivity.

28. The camera system of claim 24, wherein the plurality of image types includes at least two of: a monochrome image, a high dynamic resolution monochrome image, a tri-chromatic image, a high dynamic resolution tri-chromatic image, and a multispectral image.

29. The camera system of claim 24, wherein each of the plurality of primary filters has a greater transmittance than each of the plurality of secondary filters.

30. The camera system of claim 24, wherein the color filter array includes a first color filter having the first spectral response, a second color filter having the second spectral response, a third color filter having the third spectral response, a fourth color filter having the fourth spectral response, a fifth color filter having the fifth spectral response, a sixth color filter having the sixth spectral response, and a seventh color filter having the seventh spectral response, and wherein the plurality of primary filters includes the first color filter, the second color filter, and the third color filter and the plurality of secondary filters includes the fourth color filter, the fifth color filter, the sixth color filter, and the seventh color filter.

31. An image processing system, the system comprising:
a processor that is configured to:
receive information corresponding to an image from a color filter array,
wherein the color filter array includes a plurality of primary filters and a plurality of secondary filters, wherein each of the plurality of primary filters and each of the plurality of secondary filters has a particular spectral response, wherein each of the plurality of primary filters and each of the plurality of secondary filters is formed on a corresponding pixel of a plurality of pixels,
wherein each of the plurality of primary filters and each of the plurality of secondary filters enhances an attribute of image quality and wherein the information obtained using the plurality of primary filters and the plurality of secondary filters during a single exposure of the plurality of pixels is used to balance spatial resolution and image quality for generating at least two images that are each of a different image type of a plurality of image types,
wherein a first subset of filters includes primary filters of the plurality of primary filters having a first spectral response, a second subset of filters includes primary filters of the plurality of primary filters having a second spectral response, and a third subset of filters includes primary filters of the plurality of primary filters having a third spectral response, where each of the first subset, second subset, and third subset are arranged such that each primary filter of that subset is separated by about twice the length of the pixel corresponding to that primary filter measured from the center of the pixel to another primary filter of that subset in both the horizontal and vertical directions,
a fourth subset of filters includes secondary filters of the plurality of secondary filters having a fourth spectral response, a fifth subset of filters includes secondary filters of the plurality of secondary filters having a fifth spectral response, a sixth subset of filters includes secondary filters of the plurality of secondary filters having a sixth spectral response, and a seventh subset of filters includes secondary filters of the plurality of secondary filters having a seventh spectral response, where each of the fourth subset, fifth subset, sixth subset and seventh subset are arranged such that each secondary filter of that subset is separated by about four times the length of the pixel corresponding to that secondary filter measured from the center of the pixel to another secondary filter of that subset in both the horizontal and vertical directions, and
wherein each of the first through third subsets of filters have a different spectral response, the fifth spectral response is highly correlated with the first spectral response and has a lower transmittance than the first spectral response, the fifth and sixth spectral responses are each highly correlated with different portions of the second spectral response and each have lower transmittance than the second spectral response, and the seventh spectral response is highly correlated with the third spectral response and has a lower transmittance than the third spectral response; and
generate the at least two images from the received information that are each of a different image type of the plurality of image types, wherein one of the at least two images is based primarily on the information from pixels corresponding to the plurality of primary filters, and another of the at least two images is based on both the information from pixels corresponding to the plurality of primary filters and the information from pixels corresponding to the plurality of secondary filters.

32. The image processing system of claim 31, wherein the processor is further configured to generate a monochrome image using primarily the information from pixels corresponding to the plurality of primary filters.

33. The image processing system of claim 32, wherein the processor is further configured to generate a high dynamic range image by generating a low exposure monochrome image using primarily the information from pixels corresponding to the plurality of secondary filters and combining the low exposure monochrome image with the monochrome image.

34. The image processing system of claim 31, wherein the processor is further configured to generate a tri-chromatic image using primarily the information from pixels corresponding to the plurality of primary filters.

35. The image processing system of claim 34, wherein the processor is further configured to generate the tri-chromatic image using a color reproduction matrix and a linear transformation to combine the information from pixels corresponding to the plurality of primary filters.

36. The image processing system of claim 34, wherein the processor is further configured to generate a high dynamic range tri-chromatic image by generating a low exposure tri-chromatic image using primarily the information from pixels corresponding to the plurality of secondary filters and combining the low exposure tri-chromatic image with the tri-chromatic image.

37. The image processing system of claim 36, wherein the processor is further configured to generate the low exposure tri-chromatic image by estimating aliasing of the information from pixels corresponding to the plurality of secondary filters using the information from pixels corresponding to the plurality of primary filters.

38. The image processing system of claim 31, wherein the processor is further configured to generate a multispectral image, wherein the information from pixels corresponding to the plurality of secondary filters is anti-aliased and wherein the anti-aliased information from pixels corresponding to the plurality of secondary filters and the information from pixels corresponding to the plurality of primary filters is used to reconstruct spectral reflectance for the multispectral image.

* * * * *